(12) United States Patent
Makiyama et al.

(10) Patent No.: US 9,184,272 B2
(45) Date of Patent: Nov. 10, 2015

(54) COMPOUND SEMICONDUCTOR DEVICE HAVING OVERHANG-SHAPED GATE

(71) Applicant: FUJITSU LIMITED, Kawasaki (JP)

(72) Inventors: Kozo Makiyama, Kawasaki (JP); Naoya Okamoto, Isehara (JP); Toshihide Kikkawa, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/932,360

(22) Filed: Jul. 1, 2013

(65) Prior Publication Data

US 2014/0016360 A1    Jan. 16, 2014

(30) Foreign Application Priority Data

Jul. 10, 2012   (JP) ................. 2012-155084

(51) Int. Cl.
| | | |
|---|---|---|
| H01L 31/0328 | (2006.01) | |
| H01L 29/76 | (2006.01) | |
| H01L 31/0336 | (2006.01) | |
| H01L 29/778 | (2006.01) | |
| H01L 29/66 | (2006.01) | |

(Continued)

(52) U.S. Cl.
CPC .......... *H01L 29/778* (2013.01); *H01L 29/2003* (2013.01); *H01L 29/402* (2013.01); *H01L 29/42372* (2013.01); *H01L 29/66431* (2013.01); *H01L 29/66462* (2013.01); *H01L 29/7787* (2013.01); *H02M 3/335* (2013.01); *H02M 3/33592* (2013.01); *Y02B 70/1475* (2013.01)

(58) Field of Classification Search
CPC .............. H01L 29/2003; H01L 29/402; H01L 29/7787; H01L 29/66462; H01L 29/42316; H01L 29/778; H01L 29/812; H01L 29/8128

USPC .......... 257/194, 192, E29.246, E29.253, 409, 257/E29.321, 183, 280, 488, 284, E21.624, 257/E27.068

See application file for complete search history.

(56) References Cited

U.S. PATENT DOCUMENTS

| | | | | |
|---|---|---|---|---|
| 5,872,369 A | * | 2/1999 | Inokuchi | .......................... 257/66 |
| 6,100,571 A | * | 8/2000 | Mizuta et al. | .................. 257/488 |

(Continued)

FOREIGN PATENT DOCUMENTS

| | | |
|---|---|---|
| CN | 1166694 A | 12/1997 |
| JP | 2000-100831 | 4/2000 |
| JP | 2003-59944 A1 | 2/2003 |

OTHER PUBLICATIONS

Office Action of Taiwanese Patent Application 102124138 dated Mar. 23, 2015. Translation of the relevant part, summary of the Office Action.

(Continued)

*Primary Examiner* — Shouxiang Hu
(74) *Attorney, Agent, or Firm* — Kratz, Quintos & Hanson, LLP

(57) ABSTRACT

A compound semiconductor device includes: a compound semiconductor layer; a protective insulating film that covers a top of the compound semiconductor layer; and a gate electrode formed on the protective insulating film, wherein the protective insulating film has a first trench and a second trench which is formed side by side with the first trench and in which the protective insulating film remains with only a predetermined thickness on the compound semiconductor layer, and wherein the gate electrode fills the first trench, and one end of the gate electrode is away from the first trench and located at least in the second trench.

7 Claims, 31 Drawing Sheets

(51) Int. Cl.
*H02M 3/335* (2006.01)
*H01L 29/40* (2006.01)
*H01L 29/423* (2006.01)
*H01L 29/20* (2006.01)

(56) References Cited

U.S. PATENT DOCUMENTS

| | | | |
|---|---|---|---|
| 6,483,135 B1 | 11/2002 | Mizuta | |
| 7,573,078 B2 * | 8/2009 | Wu et al. | 257/194 |
| 8,283,699 B2 * | 10/2012 | Wu | 257/192 |
| 8,901,604 B2 * | 12/2014 | Mishra et al. | 257/170 |
| 2003/0006437 A1 | 1/2003 | Mizuta | |
| 2008/0128752 A1 | 6/2008 | Wu | |
| 2012/0146728 A1 * | 6/2012 | Makiyama et al. | 330/277 |

OTHER PUBLICATIONS

CN 201310284714.5: Office Action issued Aug. 28, 2015.

* cited by examiner

COMPARATIVE EXAMPLE

FIRST EMBODIMENT

COMPARATIVE EXAMPLE

MODIFICATION EXAMPLE 1 OF FIRST EMBODIMENT

COMPARATIVE EXAMPLE

MODIFICATION EXAMPLE 2 OF FIRST EMBODIMENT

COMPARATIVE EXAMPLE

MODIFICATION EXAMPLE 3 OF FIRST EMBODIMENT

COMPOUND SEMICONDUCTOR DEVICE HAVING OVERHANG-SHAPED GATE

CROSS-REFERENCE TO RELATED APPLICATION

This application is based upon and claims the benefit of priority of the prior Japanese Patent Application No. 2012-155084, filed on Jul. 10, 2012, the entire contents of which are incorporated herein by reference.

FIELD

The embodiments discussed herein are directed to a compound semiconductor device and a method of manufacturing the same.

BACKGROUND

Semiconductor devices, in particular, nitride semiconductor devices have been actively developed as high-withstand-voltage, high-power semiconductor devices, by utilizing their characteristics such as a high saturation electron velocity, a wide band gap, and so on. Many reports have been made on field-effect transistors, in particular, HEMTs (High Electron Mobility Transistors) as the nitride semiconductor devices. Especially, an AlGaN/GaN HEMT using GaN as an electron transit layer and using AlGaN as an electron supply layer has been drawing attention. In the AlGaN/GaN HEMT, a distortion resulting from a difference in lattice constant between GaN and AlGaN occurs in AlGaN. Owing to piezoelectric polarization caused by the distortion and to spontaneous polarization of AlGaN, a high-concentration two-dimensional electron gas (2DEG) is obtained. This makes it possible to realize high withstand voltage and high output power.

Patent Document 1: Japanese Laid-open Patent Publication No. 2003-59944

Patent Document 2: Japanese Laid-open Patent Publication No. 2000-100831

For the HEMT, research and development are advanced for a gate electrode which can reduce the gate capacitance and the gate resistance in order to improve the high-frequency characteristics. An HEMT is devised which has a gate electrode in a so-called overhanging shape composed of a narrow fine gate and a wide over gate thereon. In the HEMT, when a high drain voltage is applied, a high electric field is applied around the gate electrode. In particular, very high electric fields concentrate on the fine gate end and the over gate end. This high electric field damages semiconductor crystals at the fine gate end and damages a protective insulating that covers the semiconductor surface at the over gate end. In either case, the high electric field causes deterioration or breakdown of device characteristics, thereby significantly decreasing the reliability of the device.

SUMMARY

An aspect of a compound semiconductor device includes: a compound semiconductor layer; a protective insulating film that covers a top of the compound semiconductor layer; and an electrode formed on the protective insulating film or in an opening of the protective insulating film, wherein the protective insulating film has a first trench and a second trench which is formed side by side with the first trench, wherein the protective insulating film remains with only a thickness on the compound semiconductor at a bottom of the second trench, and wherein the electrode fills the first trench, and one end of the electrode is away from the first trench and located at least in the second trench.

An aspect of a method of manufacturing a compound semiconductor device includes: forming a protective insulating film that covers a top of a compound semiconductor layer and has a first trench and a second trench which is formed side by side with the first trench, forming, on the protective insulating film or in an opening of the protective insulating film, an electrode that fills the first trench and has one end away from the first trench and located at least in the second trench, and wherein the protective insulating film remains with only a thickness on the compound semiconductor at a bottom of the second trench.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described in detail with reference to the drawings. In the following embodiments, a structure of a compound semiconductor device will be described along with a method of manufacturing the compound semiconductor device.

Note that, in the following drawings, some constituent members are not illustrated with relatively accurate size and thickness for convenience of illustration.

First Embodiment

In this embodiment, a Schottky-type AlGaN/GaN HEMT is disclosed as the compound semiconductor device.

FIG. 1A to FIG. 1C to FIG. 3A to FIG. 3C are schematic cross-sectional views illustrating a method of manufacturing the Schottky-type AlGaN/GaN HEMT according to the first embodiment in order of processes.

Figure 1A:
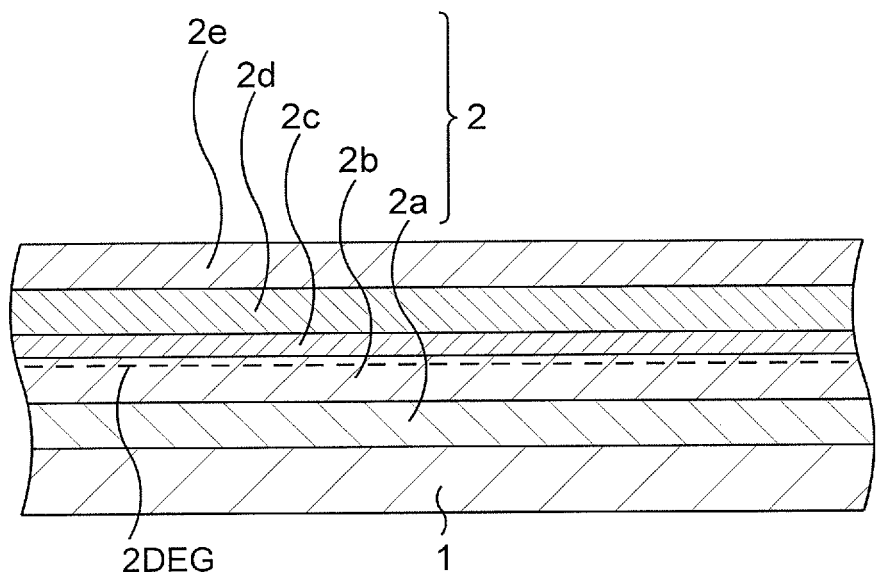
FIG. 1A to FIG. 1C are schematic cross-sectional views illustrating a method of manufacturing a Schottky-type AlGaN/GaN HEMT according to a first embodiment in order of processes.

First, as illustrated in FIG. 1A, a compound semiconductor layer 2 having a stacked structure of compound semiconductors is formed on, for example, a semi-insulating SiC substrate 1 being a growth substrate.

As the growth substrate, a Si substrate, a sapphire substrate, a GaAs substrate, a GaN substrate, or the like may be used instead of the SiC substrate. The conductivity of the substrate may be either semi-insulating or conductive.

The compound semiconductor layer 2 includes a buffer layer 2a, an electron transit layer 2b, an intermediate layer 2c, an electron supply layer 2d and a cap layer 2e. In the AlGaN/GaN HEMT, two-dimensional electron gas (2DEG) is generated in the vicinity of an interface, of the electron transit layer 2b, with the electron supply layer 2d (to be exact, the intermediate layer 2c).

More specifically, on the SiC substrate 1, the following compound semiconductors are grown by, for example, an MOVPE (Metal Organic Vapor Phase Epitaxy) method. An MBE (Molecular Beam Epitaxy) method or the like may be used instead of the MOVPE method.

On the SiC substrate 1, AlN, i (intentionally undoped)-GaN, i-AlGaN, n-AlGaN and n-GaN are sequentially deposited to stack and form the buffer layer 2a, the electron transit layer 2b, the intermediate layer 2c, the electron supply layer 2d and the cap layer 2e. As the growth condition of AlN, GaN, AlGaN and GaN, a mixed gas of trimethylaluminum gas, trimethylgallium gas and ammonia gas is used as a source gas. Depending on the compound semiconductor layer that is to be grown, whether or not to supply the trimethylaluminum gas that is an Al source and the trimethylgallium gas that is a Ga source and their flow rates are appropriately set. A flow rate of the ammonia gas being a common source is set to about 100 sccm to about 10 LM. Further, growth pressure is set to about 50 Torr to about 300 Torr, and growth temperature is set to about 1000° C. to about 1200° C.

To grow GaN and AlGaN as an n-type, for example, $SiH_4$ gas containing Si is added as n-type impurity to the source gas at a predetermined flow rate, thereby doping GaN and AlGaN with Si. A doping concentration of Si is set to about $1 \times 10^{18}/cm^3$ to about $1 \times 10^{20}/cm^3$, for example, set to about $5 \times 10^{18}/cm^3$.

Here, the buffer layer 2a is formed with a thickness of about 0.1 μm, the electron transit layer 2b is formed with a thickness of about 3 μm, the intermediate layer 2c is formed with a thickness of about 5 nm, the electron supply layer 2d is formed with a thickness of about 20 nm and an Al ratio of about 0.2 to about 0.3, and the cap layer 2e is formed with a thickness of about 10 nm.

Figure 1B:
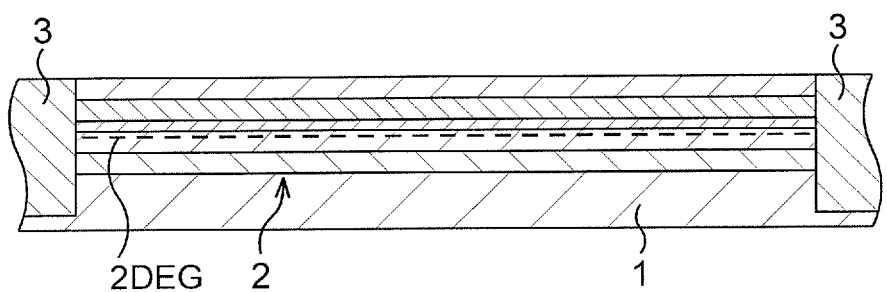

Subsequently, element isolation structures 3 are formed as illustrated in FIG. 1B.

More specifically, argon (Ar), for instance, is injected to element isolation regions of the compound semiconductor layer 2. Thus, the element isolation structures 3 are formed in the compound semiconductor layer 2 and in a surface layer portion of the SiC substrate 1. The element isolation structures 3 demarcate an active region on the compound semiconductor layer 2.

Incidentally, instead of the above injection method, an STI (Shallow Trench Isolation) method, for instance, may be performed for the element isolation.

Figure 1C:
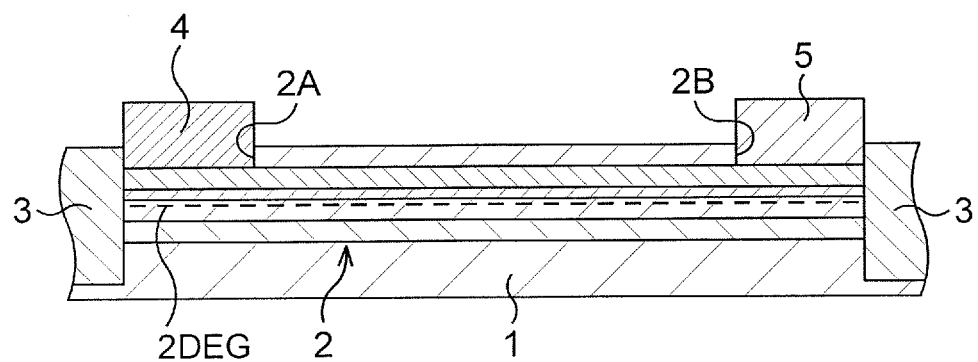

Subsequently, as illustrated in FIG. 1C, a source electrode 4 and a drain electrode 5 are formed.

More specifically, electrode trenches 2A, 2B are first formed in the cap layer 2e at formation scheduled positions for a source electrode and a drain electrode in a surface of the compound semiconductor layer 2.

A resist mask having openings at the formation scheduled positions for the source electrode and the drain electrode in the surface of the compound semiconductor layer 2 is formed. By using this resist mask, the cap layer 2e is removed by dry etching. Thus, the electrode trenches 2A, 2B are formed. An inert gas such as Ar and chlorine gas such as $Cl_2$ are used as an etching gas for the dry etching. Here, the electrode trenches may be formed by dry etching to penetrate through the cap layer 2e down to a surface layer portion of the electron supply layer 2d.

As an electrode material, Ti/Al are used, for instance. To form the electrodes, an eaves-structure two-layer resist suitable for a vapor deposition method and a liftoff method is used. This resist is applied on the compound semiconductor layer 2 to form a resist mask having openings at the electrode grooves 2A, 2B. Ti/Al are deposited by using this resist mask. A thickness of Ti is about 20 nm and a thickness of Al is about 200 nm. By the liftoff method, the resist mask with the eaves structure and Ti/Al deposited thereon are removed. Thereafter, the SiC substrate 1 is heat-treated at about 550° C. in, for example, a nitrogen atmosphere, and the residual Ti/Al are brought into ohmic contact with the electron supply layer 2d. Through the above processes, the source electrode 4 and the drain electrode 5 having the electrode trenches 2A, 2B embedded under Ti/Al are formed.

Figure 2A:
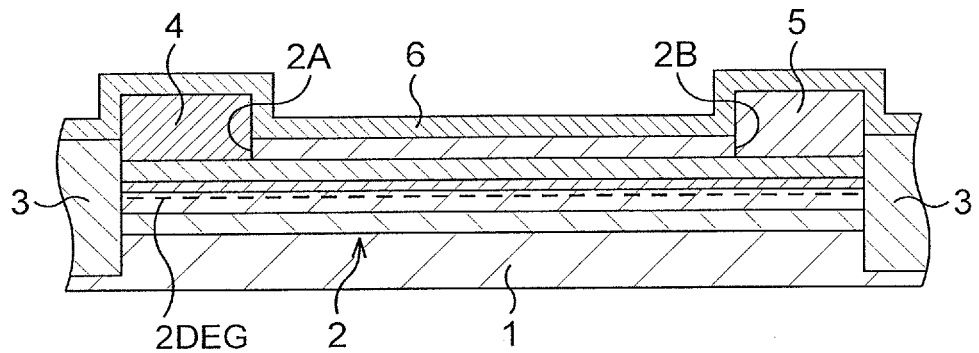
FIG. 2A to FIG. 2C are schematic cross-sectional views, subsequent to FIG. 1A to FIG. 1C, illustrating the method of manufacturing the AlGaN/GaN HEMT according to the first embodiment in order of processes.

Subsequently, as illustrated in FIG. 2A, a protective insulating film 6 is formed.

More specifically, an insulator, for example, silicon nitride (SiN) is deposited on the whole surface of the compound semiconductor layer 2 to, for example, a thickness of about 60 nm by a plasma CVD method or the like. Thus, the protective insulating film 6 is formed.

As the material of the protective insulating film, alumina ($Al_2O_3$), silicon oxide ($SiO_2$), silicon oxynitride (SiON) or the like can be used instead of SiN.

Figure 2B:
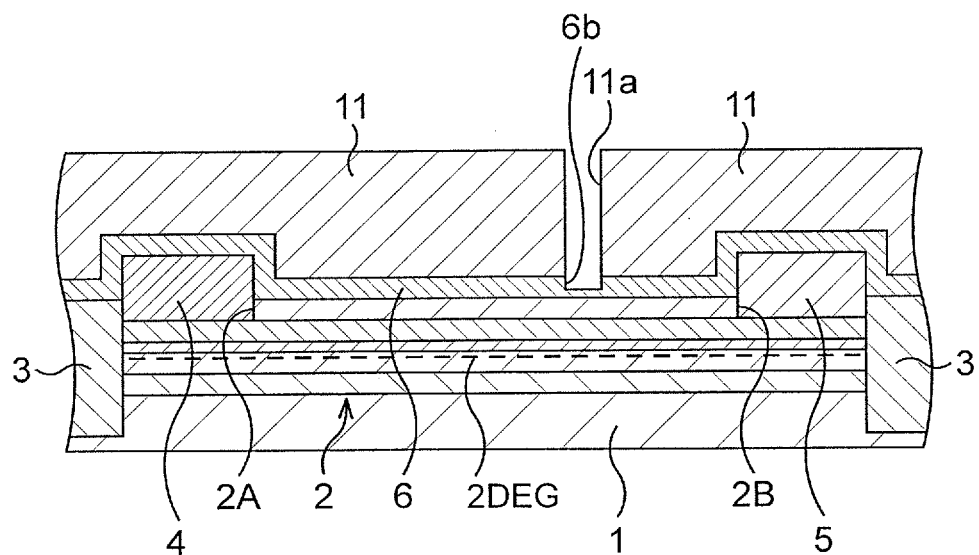

Subsequently, as illustrated in FIG. 2B, a second trench 6b is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 400 nm on the applied resist, and the resist is developed. For example, NMD-W (trade name) manufactured by Tokyo Ohka Kogyo Co., Ltd. is used as a developing solution. Thus, a resist mask 11 having an opening 11a is formed.

Next, dry etching using the resist mask 11 is performed on the protective insulating film 6 so that the protective insulating film 6 remains with only a predetermined thickness at the bottom of the opening 11a. For example, $SF_6$ is used as an etching gas. Thus, the second trench 6b having a width of about 400 nm and a depth of, for example, about 30 nm (the thickness of the remaining protective insulating film 6 is about 30 nm) is formed in the protective insulating film 6. The second trench 6b is formed at a site biased toward the drain electrode 5, here, a site where 0.2 μm or more of an over gate of a gate electrode to be formed is contained in the trench. A correct value of the depth of the second trench 6b is decided depending on a thickness of the protective insulating film 6, a dielectric breakdown withstand voltage of the protective insulating film 6, a potential difference between a drain voltage and a gate voltage, a peak value of swing of the gate voltage and soon.

The resist mask 11 is removed by ashing using oxygen plasma or wet treatment using a chemical.

Figure 2C:
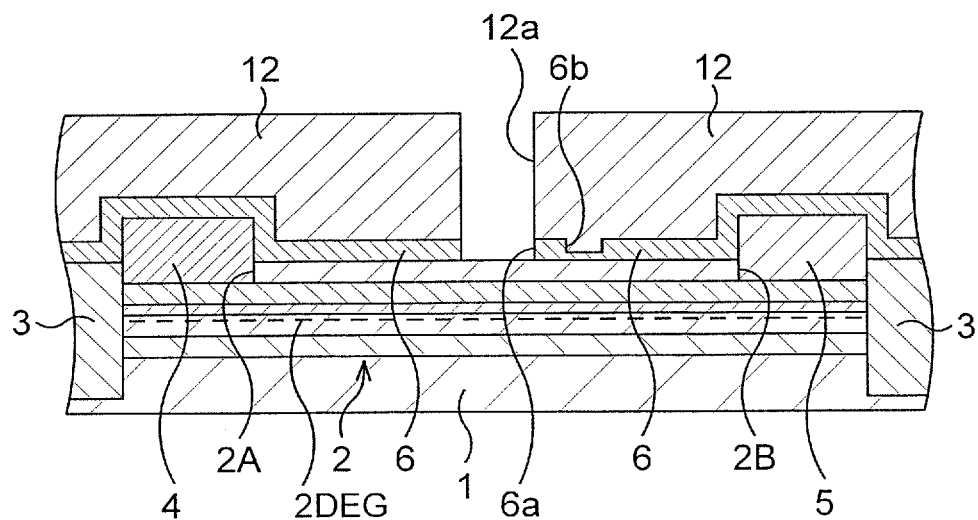

Subsequently, as illustrated in FIG. 2C, a first trench 6a is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 12 having an opening 12a is formed.

Next, dry etching using the resist mask 12 is performed on the protective insulating film 6 until the surface of the cap layer 2e is exposed at the bottom of the opening 12a. For example, $SF_6$ is used as an etching gas. Thus, the first trench 6a that is a through trench having a width of about 600 nm and exposing the surface of the cap layer 2e is formed in the protective insulating film 6. The first trench 6a is formed at a formation scheduled site for a fine gate of a gate electrode to be formed at subsequent processes, side by side with the second trench 6b in the protective insulating film 6.

The resist mask 12 is removed by ashing using oxygen plasma or wet treatment using a chemical.

The case of forming the first trench 6a after forming the second trench 6b in the protective insulating film 6 is exemplified in FIG. 2B and FIG. 2C, but the order of processes may be inverted so that the second trench 6b may be formed after the first trench 6a is formed in the protective insulating film 6.

Figure 3A:
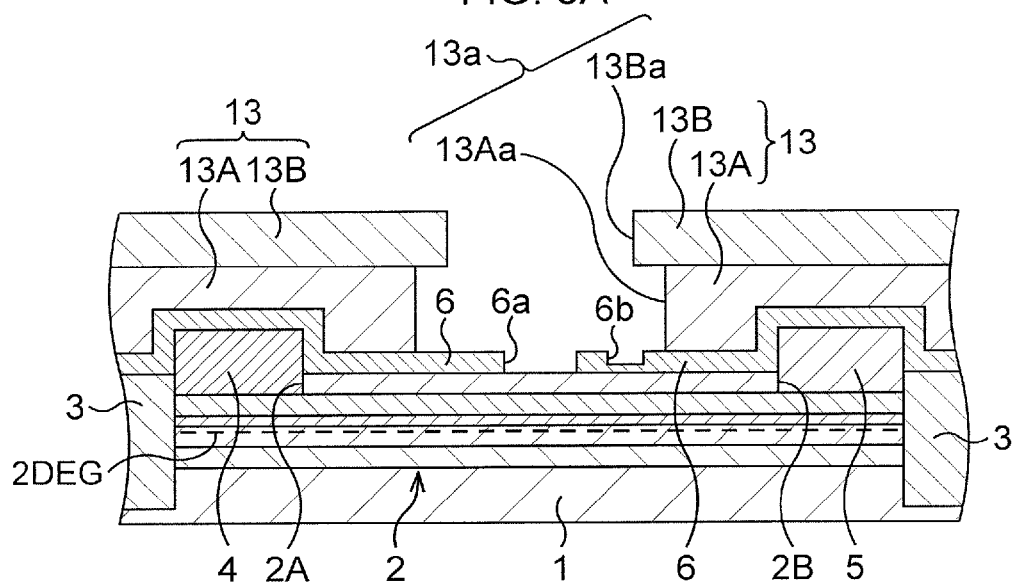
FIG. 3A to FIG. 3C are schematic cross-sectional views, subsequent to FIG. 2A to FIG. 2C, illustrating the method of manufacturing the AlGaN/GaN HEMT according to the first embodiment in order of processes.

Subsequently, as illustrated in FIG. 3A, a resist mask 13 for forming a gate is formed.

More specifically, each of a lower-layer resist 13A (for example, PMGI (trade name): manufactured by Micro-Chem. Inc. in the United States) and an upper-layer resist 13B (PFI-32 (trade name): manufactured by Sumitomo Chemical Co., Ltd.) is first applied on the whole surface, for example, by a spin coating method. Ultraviolet exposure is performed to form an opening 13Ba, for example, having a diameter of about 1.5 μm in the upper-layer resist 13B. Next, a wet etching using an alkali developing solution is performed on the lower-layer resist 13A while using the upper-layer resist 13B as a mask to thereby form an opening 13Aa in the lower-layer resist 13A. Thus, the resist mask 13 is formed which is composed of the lower-layer resist 13A having the opening 13Aa and the upper-layer resist 13B having the opening 13Ba. In the resist mask 13, an opening where the opening 13Aa and the opening 13Ba communicate with each other is denoted by 13a.

Figure 3B:
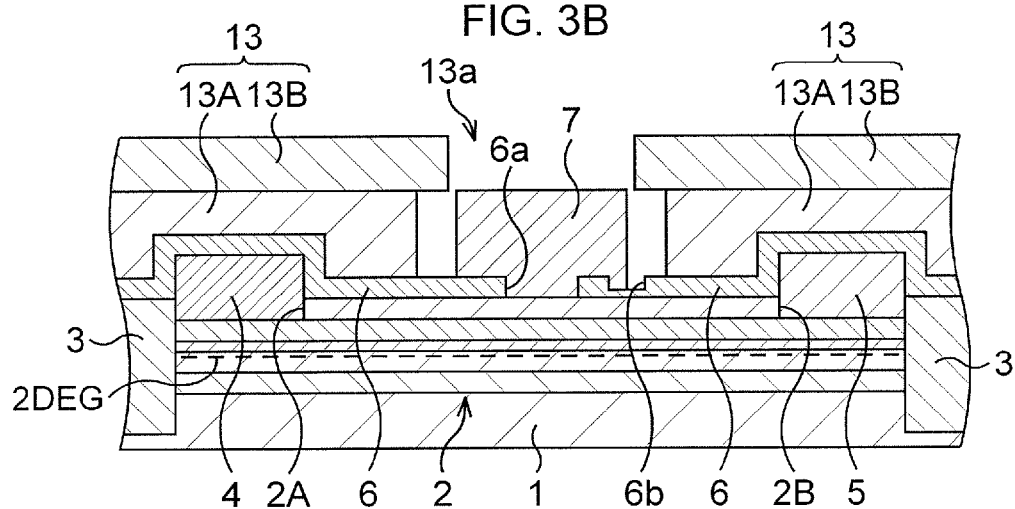

Subsequently, as illustrated in FIG. 3B, a gate electrode 7 is formed.

More specifically, gate metals (Ni: a thickness of about 10 nm/Au: a thickness of about 300 nm) are deposited on the whole surface including the inside of the opening 13a using the resist mask 13. Thus, the gate electrode 7 is formed.

Figure 3C:
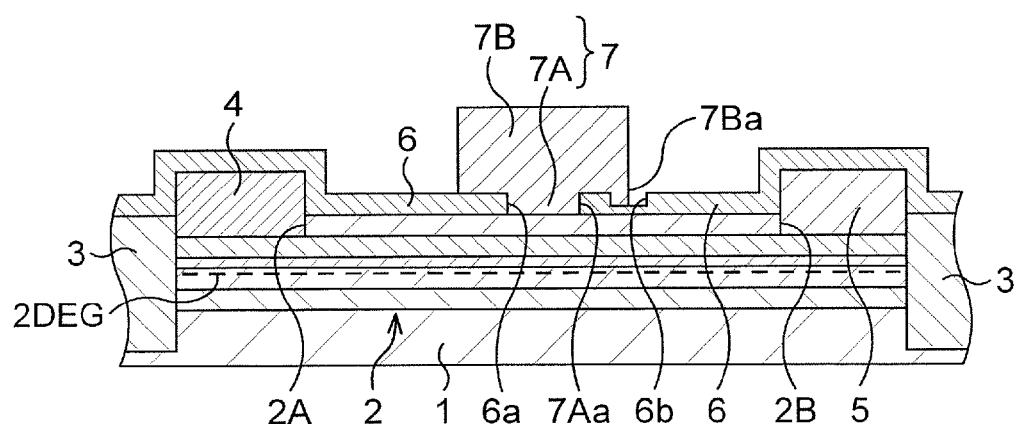

Subsequently, as illustrated in FIG. 3C, the resist mask 13 is removed.

More specifically, the SiC substrate 1 is immersed in N-methyl-pyrrolidinone warmed at 80° C., and the resist mask 13 and unnecessary gate metals are removed by the liftoff method.

The gate electrode 7 is in a so-called overhanging shape in which a fine gate 7A at a lower part fills the inside of the first trench 6a and is in Schottky contact with the surface of the compound semiconductor layer 2, and an over gate 7B at an upper part is formed wider than the fine gate 7A. In the gate electrode 7, one end (an electrode end on the drain electrode 5 side, defined as an OG end 7Ba) of the over gate 7B is located inside the second trench 6b. Specifically, the OG end 7Ba is formed at a site, inside the second trench 6b, away from an end portion on the gate electrode 7 side of the second trench 6b toward the drain electrode 5 by 0.2 μm or more. An electrode end on the drain electrode 5 side of the fine gate 7A is an FG end 7Aa.

Thereafter, through processes of electrical connection of the source electrode 4, the drain electrode 5, and the gate electrode 7 and so on, the Schottky-type AlGaN/GaN HEMT is formed.

Hereinafter, operations and effects that the AlGaN/GaN HEMT according to this embodiment has will be described based on comparison with a comparative example.

Figure 4A:
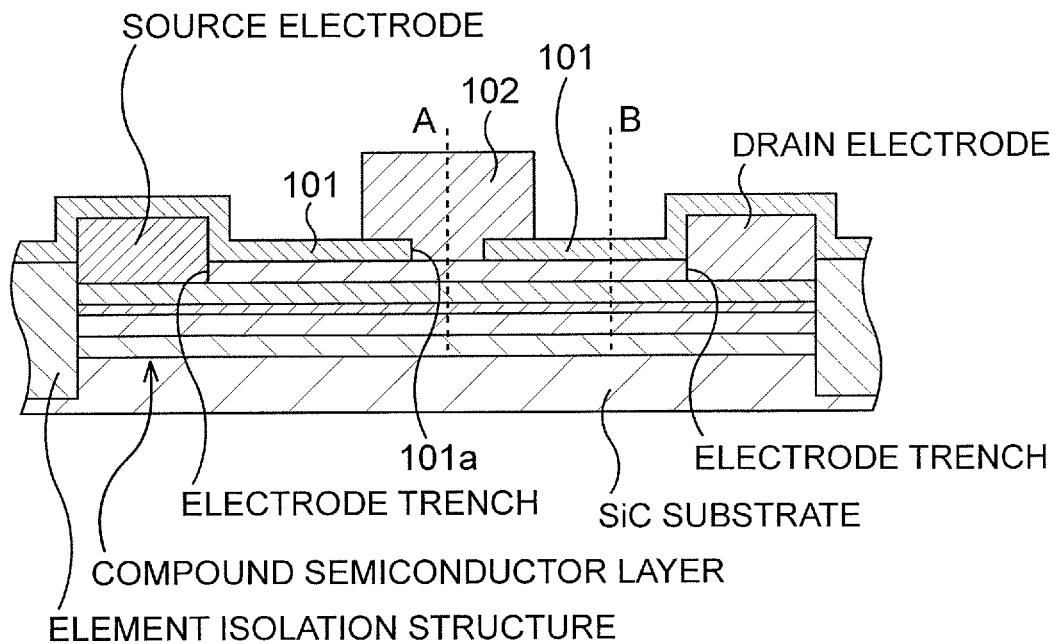
FIG. 4A and FIG. 4B are a view illustrating a conventional AlGaN/GaN HEMT as a comparative example and a chart presenting the intensity of an electric field applied to a region between a source and a drain thereof.
Figure 4B:
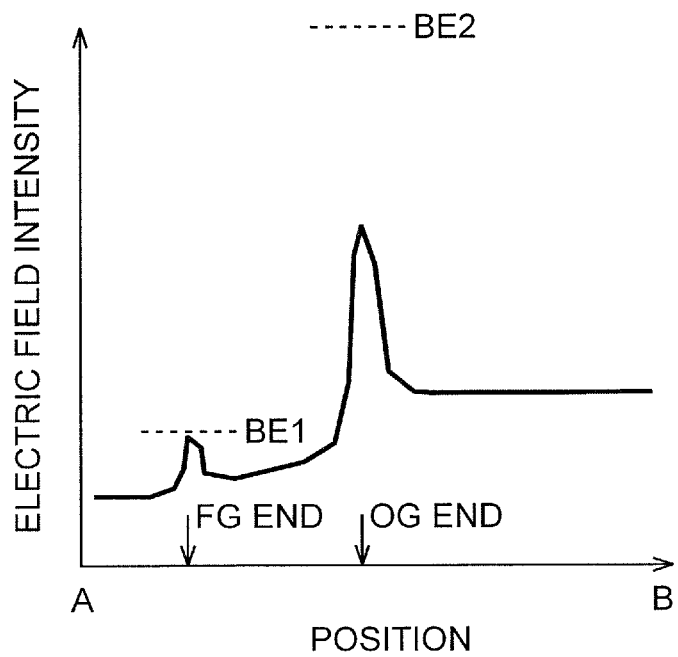
Figure 5A:
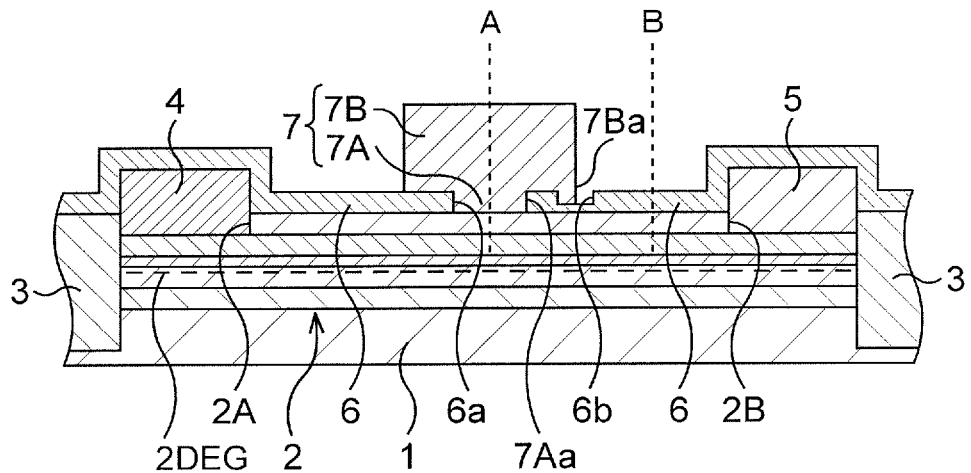
FIG. 5A and FIG. 5B are a view illustrating the AlGaN/GaN HEMT according to the first embodiment and a chart presenting the intensity of an electric field applied to a region between a source and a drain thereof.
Figure 5B:
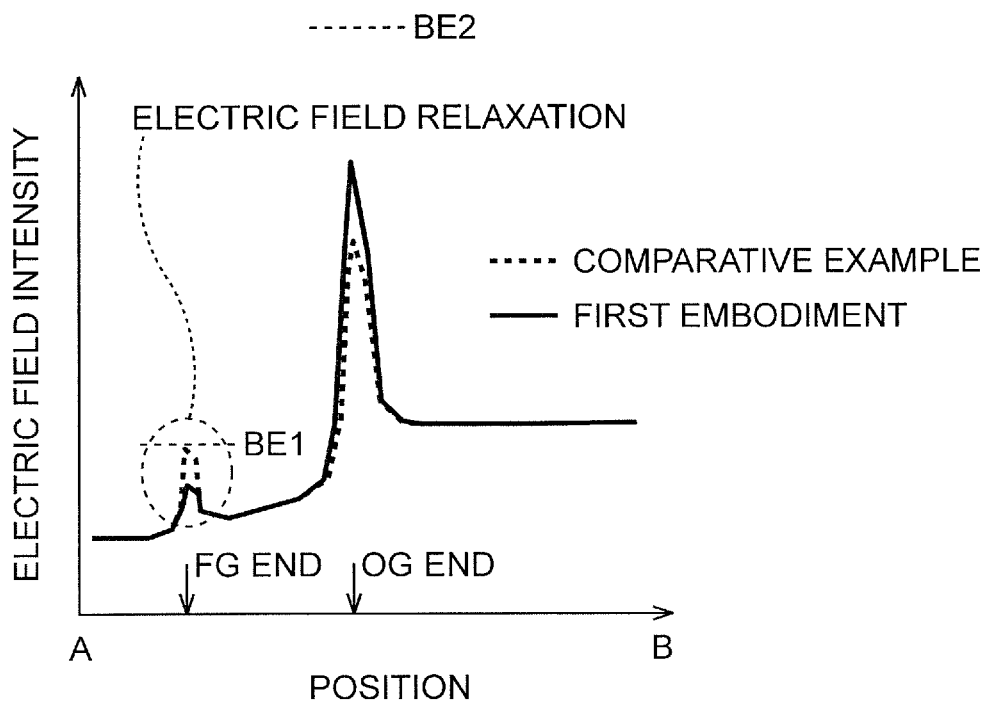

FIG. 4A and FIG. 4B are a view illustrating a conventional AlGaN/GaN HEMT as the comparative example of this embodiment and a chart presenting the intensity of an electric field applied to a region between a source and a drain thereof. FIG. 4A is a schematic cross-sectional view of the AlGaN/GaN HEMT and FIG. 4B presents a characteristic chart of the electric field intensity. FIG. 5A and FIG. 5B are a view illustrating the AlGaN/GaN HEMT according to this embodiment and a chart presenting the intensity of an electric field applied to a region between a source and a drain thereof. FIG. 5A is a schematic cross-sectional view of the AlGaN/GaN HEMT corresponding to FIG. 3C and FIG. 5B presents a characteristic chart of the electric field intensity.

In the Schottky-type AlGaN/GaN HEMT of the comparative example, a protective insulating film 101 is formed as illustrated in FIG. 4A instead of the protective insulating film 6 in FIG. 3C, and a gate electrode 102 is formed instead of the gate electrode 7. The protective insulating film 101 is formed to be thinner than the protective insulating film 6 and have a thickness of, for example, about 50 nm. In the protective insulating film 101, an opening 101a that is a through trench corresponding to the first trench 6a in the protective insulating film 6 is formed but a trench corresponding to the second trench 6b is not formed. The gate electrode 102 is formed in an overhanging shape in which a narrow fine gate 7A fills the opening 101a and is in Schottky contact with a surface of a compound semiconductor layer 2 and a wide over gate 7B are integrated.

FIG. 4B and FIG. 5B present the electric field intensities between broken lines A and broken lines B drawn in FIG. 4A and FIG. 5A, and also present electric field intensities of breakdown limits of device characteristics at the FG ends and OG ends due to electric field concentration. The electric field intensity of breakdown limit at the FG end is defined as BE1, and the electric field intensity of breakdown limit at the OG end is defined as BE2.

In the HEMT having the gate electrode in the overhanging shape, high electric fields concentrate on the FG end and the OG end. In this case, the device characteristics are likely to deteriorate or break down more at the FG end than at the OG end, so that BE1 is lower than BE2.

In the AlGaN/GaN HEMT in the comparative example, as illustrated in FIG. 4B, the intensity of the electric field applied to the OG end is lower than the electric field intensity BE2 of the breakdown limit at the OG end and has a considerable margin with respect to BE2. In contrast, the intensity of the electric field applied to the FG end is substantially equal to the electric field intensity BE1 of the breakdown limit at the FG end and has little or no margin with respect to BE1.

A possible reason of the above in the comparative example is as follows. At the OG end, the over gate 7B is in contact with the protective insulating film 101. Therefore, BE2 is determined by the breakdown limit of the protective insulating film 101. On the other hand, at the FG end, the fine gate 7A is in contact with the compound semiconductor layer 2 and the protective insulating film 101. The semiconductor crystals in the compound semiconductor layer 2 are much lower in breakdown limit with respect to the electric field than the insulator of the protective insulating film 101. Therefore, BE 1 is determined by the breakdown limit of the compound semiconductor layer 2 that is lower than BE2. As described above, the protective insulating film 101 is high in breakdown limit with respect to the electric field and relatively has a margin with respect to the breakdown limit even if the electric field concentrates on the OG end, whereas the compound semiconductor layer 2 is low in breakdown limit with respect to the electric field and highly possibly reaches the breakdown limit if the electric field concentrates on the FG end.

In the case of applying a predetermined drain voltage, the total amount of electric field generated around the gate electrode takes an almost constant predetermined value. As described above, the deterioration or breakdown of the device characteristics due to electric field concentration most possibly occurs at the FG end, whereas there is a margin with respect to BE2 that is the breakdown limit regarding the electric field concentration on the OG end. In this embodiment, focusing attention on this point, the electric field intensity at the OG end is aggressively increased to a limit not reaching the breakdown limit to relax the electric field concentration on the FG end by the increase. By relaxing the electric field concentration on the FG end which most possibly reaches the breakdown limit, thereby suppressing the deterioration or breakdown of the device characteristics due to the electric field concentration as a whole.

The above is in a close relationship also with the thickness of the protective insulating film. With a thicker protective insulating film, the electric field concentration on the OG end is relaxed more to decrease the intensity of the electric field applied to the OG end. Along with this, the intensity of the electric field applied to the FG end increases by the decrease to result in an increase in the possibility of reaching the breakdown limit at the FG end. In order to more surely protect the compound semiconductor layer or to reduce the coupling capacitance between the gate electrode and the compound semiconductor layer so as to cope with high-frequency, the protective insulating film is required to be formed thick. Since the possibility of reaching the breakdown limit at the FG end increases when the protective insulating film is formed thick, the superiority of applying this embodiment to relax the electric field concentration on the FG end is more pronounced.

In the AlGaN/GaN HEMT according to this embodiment, the second trench 6b is formed in the protective insulating film 6 so as to thin the protective insulating film 6 in the second trench 6b. The gate electrode 7 is formed so that the OG end 7Ba is located at the site of the second trench 6b where the protective insulating film 6 is thin. This promotes extension of a depletion layer in the compound semiconductor layer 2. As illustrated in FIG. 5B, the electric field intensity at the OG end 7Ba increases to a limit not reaching BE2 that is the breakdown limit, and the electric field intensity at the FG end 7Aa decreases by the increase to relax the electric field concentration. Thus, the electric field intensity at the FG end 7Aa becomes greatly lower than BE1 that is the breakdown limit. As described above, the deterioration or breakdown of the device characteristics due to the electric field concentration is suppressed as a whole between the gate and the drain.

Figure 6A:
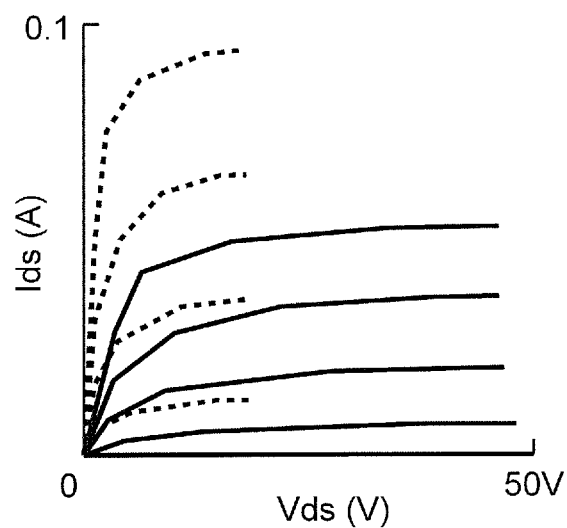
FIG. 6A and FIG. 6B are characteristic charts presenting results of three-terminal characteristics of the AlGaN/GaN HEMT according to the first embodiment investigated based on comparison with the comparative example.
Figure 6B:
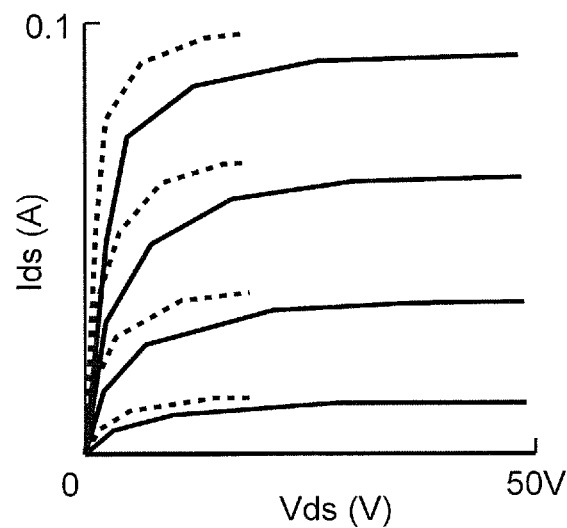

Three-terminal characteristics of the AlGaN/GaN HEMT according to this embodiment were investigated based on comparison with the above comparative example. The results are presented in FIG. 6A and FIG. 6B. FIG. 6A presents the result of the comparative example, and FIG. 6B presents the result of this embodiment. Here, solid lines indicate IV characteristics at application of Vds=20 V, and broken lines indicate IV characteristics at application of Vds=50 V.

In FIG. 6B, improvement in current collapse was confirmed as compared to FIG. 6A. This means that the electric field concentration on the FG end was relaxed to suppress electron capture by an electron trap.

Figure 7:
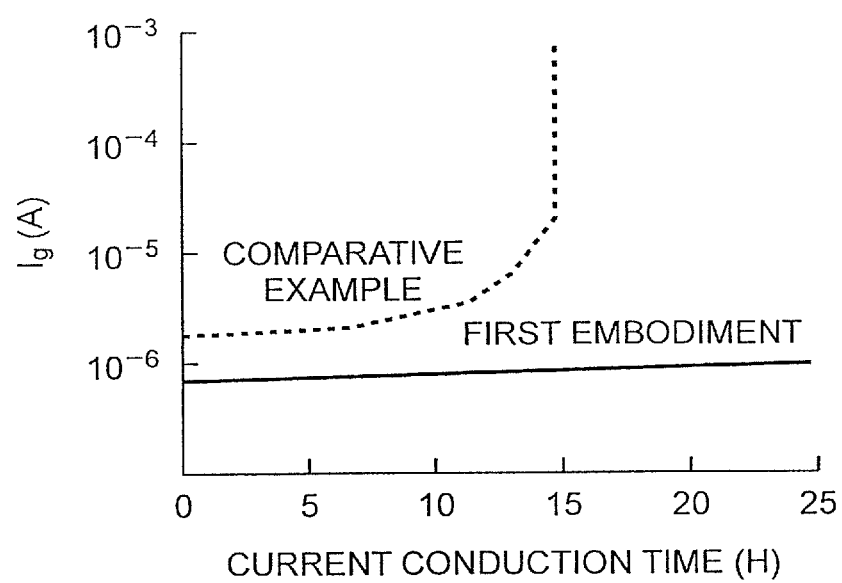
FIG. 7 is a characteristic chart presenting results of a high-temperature current conduction test carried out on the AlGaN/GaN HEMT according to the first embodiment, based on comparison with the comparative example.

Further, a high-temperature current conduction test was carried out on the AlGaN/GaN HEMT according to this embodiment based on comparison with the above comparative example. The results are presented in FIG. 7.

It was confirmed that, in this embodiment, the gate current less changed in the high-temperature current conduction test and no breakdown occurred unlike the comparative example. In other words, application of the protective insulating film 6 and the gate electrode 7 in this embodiment realizes a highly reliable AlGaN/GaN HEMT with excellent output characteristics.

As described above, according to this embodiment, a highly reliable AlGaN/GaN HEMT is realized which relaxes the electric field concentration around the gate electrode 7 by a relatively simple structure to suppress deterioration or breakdown of the device characteristics so as to achieve high withstand voltage and high output power.

MODIFICATION EXAMPLES

Hereinafter, modification examples of the Schottky-type AlGaN/GaN HEMT according to the first embodiment will be described.

Modification Example 1

Modification Example 1 is different from the first embodiment in that a second trench to be formed in a protective insulating film is different. Note that the same constituent members and so on as those of the AlGaN/GaN HEMT according to the first embodiment will be denoted by the same reference signs, and a detailed description thereof will be omitted.

FIG. 8A to FIG. 8C and FIG. 9 are schematic cross-sectional views illustrating main processes in a method of manufacturing a Schottky-type AlGaN/GaN HEMT according to Modification Example 1 of the first embodiment.

Figure 8A:
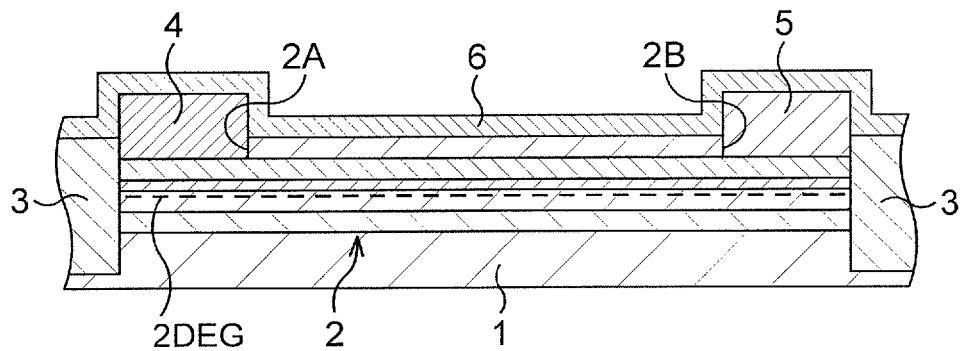
FIG. 8A to FIG. 8C are schematic cross-sectional views illustrating main processes in a method of manufacturing a Schottky-type AlGaN/GaN HEMT according to Modification Example 1 of the first embodiment.

First, through the processes in FIG. 1A to FIG. 2A of the first embodiment, a protective insulating film 6 that covers the top of a compound semiconductor layer 2 is formed. The appearance in this event is illustrated in FIG. 8A.

Figure 8B:
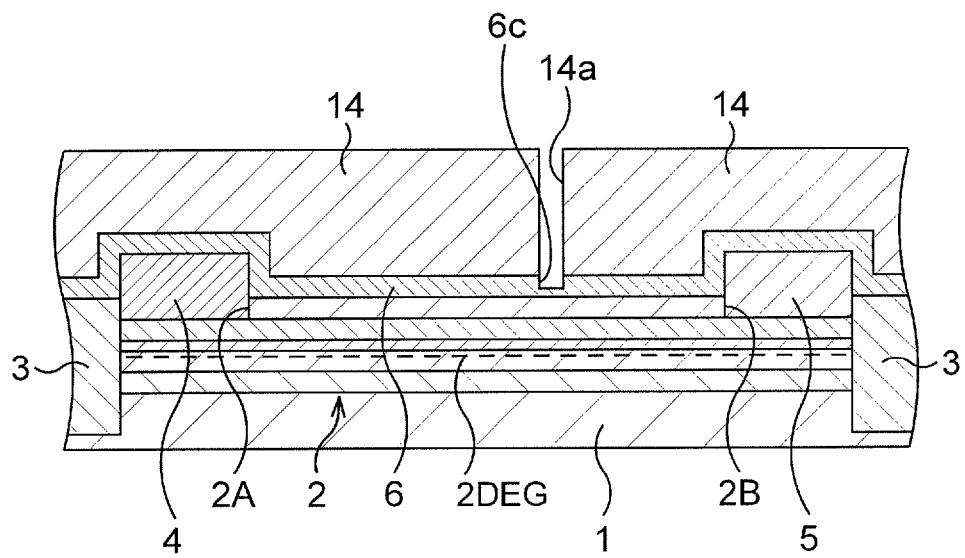

Subsequently, as illustrated in FIG. 8B, a second trench 6c is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 400 nm on the applied resist, and the resist is developed. For example, NMD-W (trade name) manufactured by Tokyo Ohka Kogyo Co., Ltd. is used as a developing solution. Thus, a resist mask 14 having an opening 14a is formed.

Next, dry etching using the resist mask 14 is performed on the protective insulating film 6 so that the protective insulating film 6 remains with only a predetermined thickness in the opening 14a. For example, $SF_6$ is used as an etching gas. Thus, the second trench 6c having a width of about 400 nm and a depth of, for example, about 30 nm (the thickness of the remaining protective insulating film 6 is about 30 nm) is formed in the protective insulating film 6. The second trench 6c is formed at a site biased toward a drain electrode 5, here, a site where the whole trench is contained in an over gate of a gate electrode to be formed. A correct value of the depth of the second trench 6c is decided depending on a thickness of the protective insulating film 6, a dielectric breakdown withstand voltage of the protective insulating film 6, a potential difference between a drain voltage and a gate voltage, a peak value of swing of the gate voltage and so on.

The resist mask 14 is removed by ashing using oxygen plasma or wet treatment using a chemical.

Figure 8C:
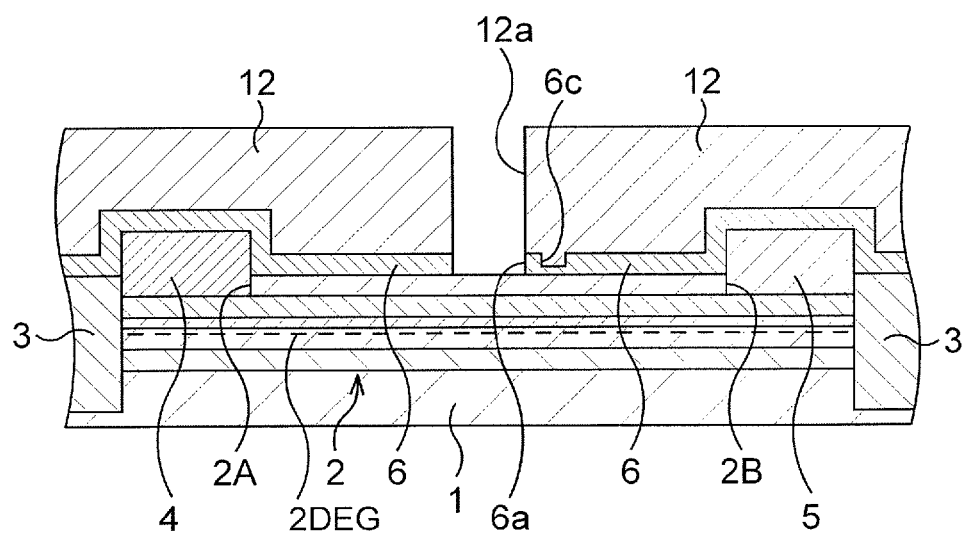

Subsequently, as illustrated in FIG. 8C, a first trench 6a is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 12 having an opening 12a is formed.

Next, dry etching using the resist mask 12 is performed on the protective insulating film 6 until the surface of a cap layer 2e is exposed at the bottom of the opening 12a. For example, $SF_6$ is used as an etching gas. Thus, the first trench 6a that is a through trench having a width of about 600 nm and exposing the surface of the cap layer 2e is formed in the protective insulating film 6. The first trench 6a is formed at a formation scheduled site for a fine gate of a gate electrode to be formed at subsequent processes, side by side with the second trench 6c in the protective insulating film 6.

The resist mask 12 is removed by aching using oxygen plasma or wet treatment using a chemical.

The case of forming the first trench 6a after forming the second trench 6c in the protective insulating film 6 is exemplified in FIG. 8B and FIG. 8C, but the order of processes may be inverted so that the second trench 6c may be formed after the first trench 6a is formed in the protective insulating film 6.

Figure 9:
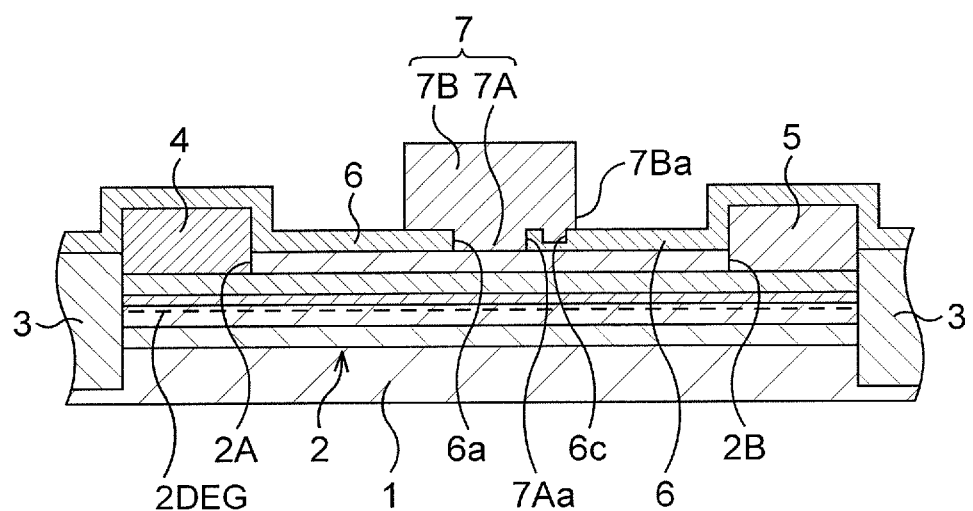
FIG. 9 is a schematic cross-sectional view, subsequent to FIG. 8A to FIG. 8C, illustrating a main process in the method of manufacturing the Schottky-type AlGaN/GaN HEMT according to Modification Example 1 of the first embodiment.

Subsequently, the processes in FIG. 3A to FIG. 3C of the first embodiment are performed. The state corresponding to FIG. 3C is illustrated in FIG. 9.

A gate electrode 7 is in an overhanging shape composed of a fine gate 7A at a lower part and an over gate 7B at an upper part wider than the fine gate 7A. The fine gate 7A fills the inside of the first trench 6a and is in Schottky contact with the surface of the compound semiconductor layer 2. The over gate 7B fills the inside of the second trench 6c and has an OG end 7Ba located at a site away from an end portion on a drain electrode 5 side of the second trench 6c toward the drain electrode 5 by about 0.1 g m.

Thereafter, through processes of electrical connection of a source electrode 4, the drain electrode 5, and the gate electrode 7 and so on, the Schottky-type AlGaN/GaN HEMT is formed.

Hereinafter, operations and effects that the AlGaN/GaN HEMT according to Modification Example 1 has will be described based on comparison with a comparative example.

Figure 10A:
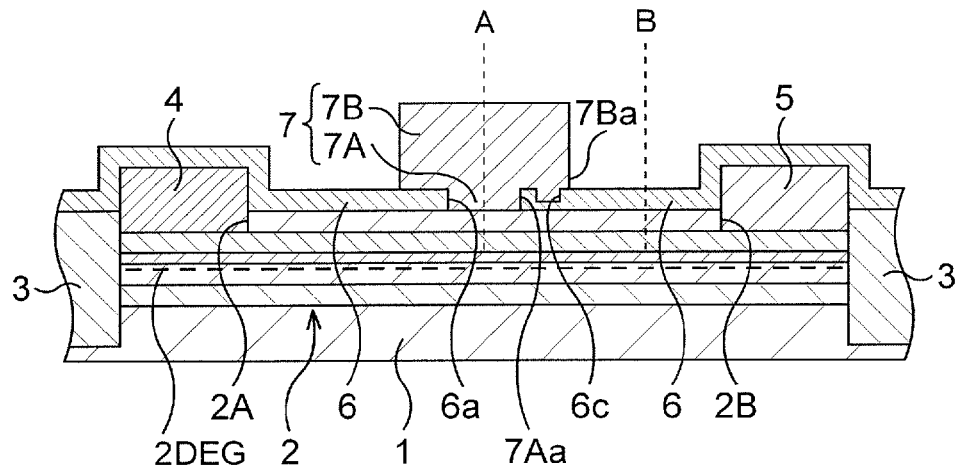
FIG. 10A and FIG. 10B are a view illustrating the AlGaN/GaN HEMT according to Modification Example 1 of the first embodiment and a chart presenting the intensity of an electric field applied to a region between a source and a drain thereof.
Figure 10B:
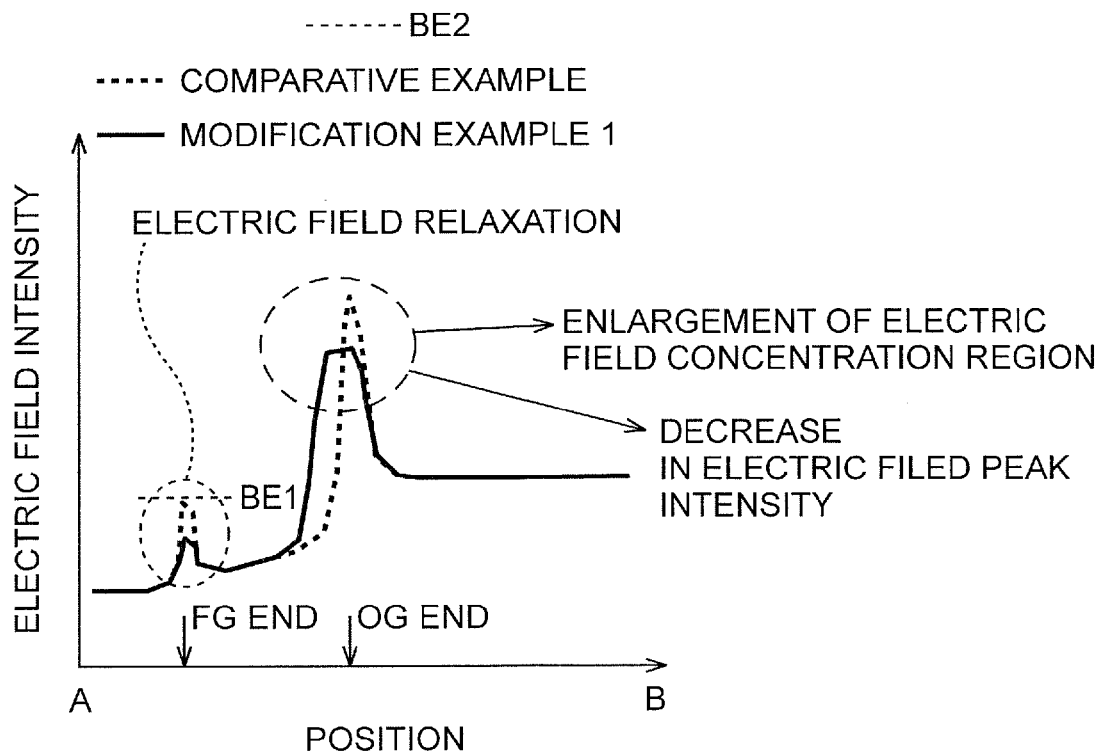

FIG. 10A and FIG. 10B are a view illustrating the AlGaN/GaN HEMT according to Modification Example 1 of this embodiment and a chart presenting the intensity of an electric field applied to a region between a source and a drain thereof. FIG. 10A is a schematic cross-sectional view of the AlGaN/GaN HEMT corresponding to FIG. 9, and FIG. 10B presents a characteristic chart of the electric field intensity. Note that the AlGaN/GaN HEMT in the comparative example is the same as that in FIG. 4A, and its characteristic chart of the electric field intensity is the same as that in FIG. 4B.

FIG. 10B presents the electric field intensity between a broken line A and a broken line B drawn in FIG. 10A, and also presents electric field intensities of breakdown limits of device characteristics at an FG end and an OG end due to electric field concentration. The electric field intensity of breakdown limit at the FG end is defined as BE1, and the electric field intensity of breakdown limit at the OG end is defined as BE2.

In the HEMT having the gate electrode in the overhanging shape, high electric fields concentrate on the FG end and the OG end. In this case, the device characteristics are likely to deteriorate or break down more at the FG end than at the OG end, so that BE1 is lower than BE2.

In the case of applying a predetermined drain voltage, the total amount of electric field generated around the gate electrode takes an almost constant predetermined value. As described above, the deterioration or breakdown of the device characteristics due to electric field concentration most possibly occurs at the FG end. In contrast, an electric field intensity close to the breakdown limit is not found in a region between the FG end and the OG end. In Modification Example 1, focusing attention on this point, the electric field intensity in the region between the FG end and the OG end is aggressively increased to a limit not reaching the breakdown limit to relax the electric field concentration on the FG end by the increase. In other words, a part of the electric field intensity at the FG end is distributed to the region between the FG end and the OG end. This relaxes the electric field concentration on the FG end which most possibly reaches the breakdown limit, thereby suppressing the deterioration or breakdown of the device characteristics due to the electric field concentration as a whole.

In the AlGaN/GaN HEMT according to Modification Example 1, the second trench 6c is formed in the protective insulating film 6 so as to thin the protective insulating film 6 in the second trench 6c. The gate electrode 7 is formed so that the over gate 7B fills and contains the second trench 6c where the protective insulating film 6 is thin. This promotes extension of a depletion layer in the compound semiconductor layer 2. As illustrated in FIG. 10B, the electric field intensity in the region between the FG end 7Aa and the OG end 7Ba increases to a limit not reaching the breakdown limit and, along with this, the peak of the electric field intensity at the FG end 7Aa decreases to relax the electric field concentration. Thus, the electric field intensity at the FG end 7Aa becomes greatly lower than BE1 that is the breakdown limit. In Modification Example 1, since a contributory portion of the increase in the electric field intensity in the region between the FG end 7Aa and the OG end 7Ba is relatively large, the peak of the electric field intensity becomes lower than that in the comparative example also at the OG end 7Ba to relax the electric field concentration. As described above, the deterioration or breakdown of the device characteristics due to the electric field concentration is suppressed as a whole between the gate and the drain.

Figure 11A:
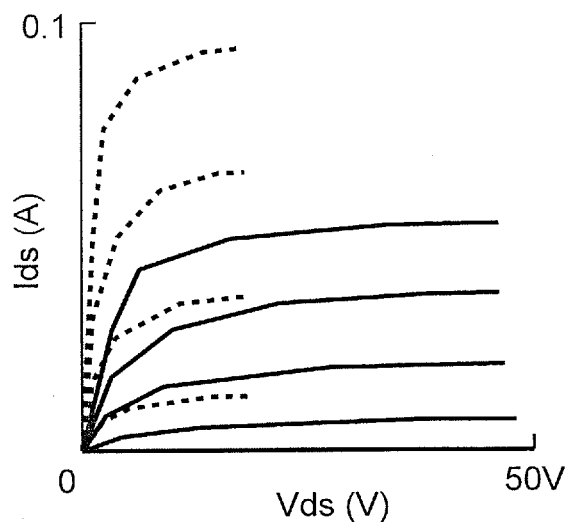
FIG. 11A and FIG. 11B are characteristic charts presenting results of three-terminal characteristics of the AlGaN/GaN HEMT according to Modification Example 1 of the first embodiment investigated based on comparison with the comparative example.
Figure 11B:
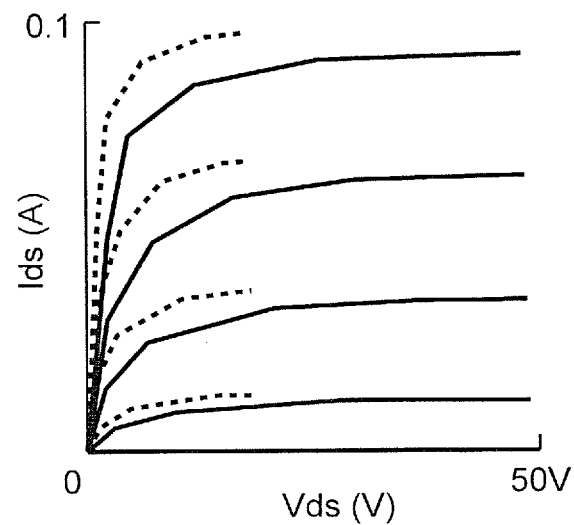

Three-terminal characteristics of the AlGaN/GaN HEMT according to Modification Example 1 were investigated based on comparison with the above comparative example. The results are presented in FIG. 11A and FIG. 11B. FIG. 11A presents the result of the comparative example, and FIG. 11B presents the result of Modification Example 1. Here, solid lines indicate IV characteristics at application of Vds=20 V, and broken lines indicate IV characteristics at application of Vds=50 V.

In FIG. 11B, improvement in current collapse was confirmed as compared to FIG. 11A. This means that the electric field concentration on the FG end was relaxed to suppress electron capture into an electron trap in Modification Example 1.

Figure 12:
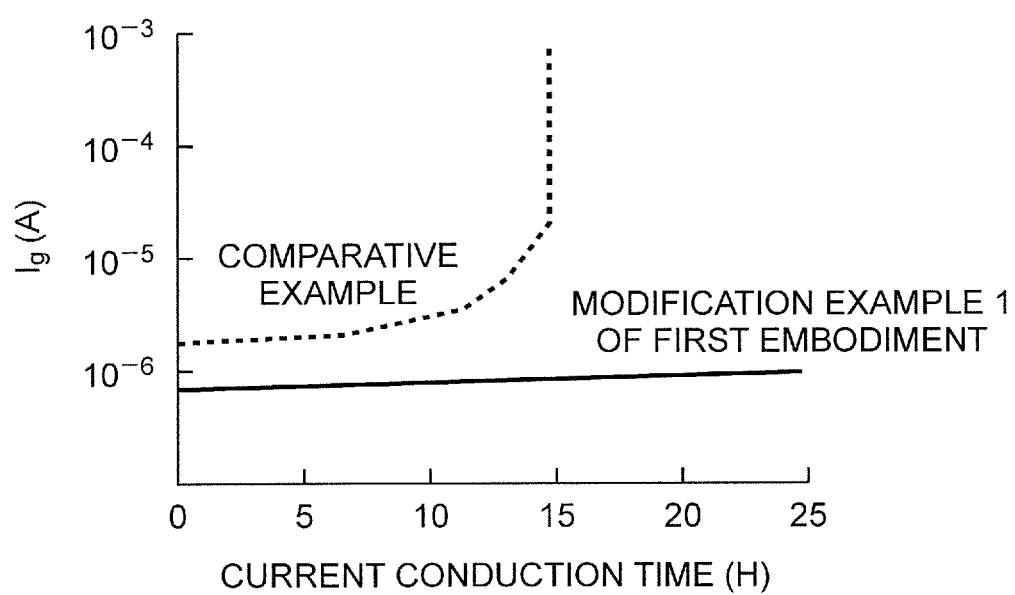
FIG. 12 is a characteristic chart presenting results of a high-temperature current conduction test carried out on the AlGaN/GaN HEMT according to Modification Example 1 of the first embodiment, based on comparison with the comparative example.

Further, a high-temperature current conduction test was carried out on the AlGaN/GaN HEMT according to Modification Example 1 based on comparison with the above comparative example. The results are presented in FIG. 12.

It was confirmed that, in Modification Example 1, the gate current less changed in the high-temperature current conduction test and no breakdown occurred unlike the comparative example. In other words, application of the protective insulating film 6 and the gate electrode 7 in Modification Example 1 realizes a highly reliable AlGaN/GaN HEMT with excellent output characteristics.

As described above, according to Modification Example 1, a highly reliable AlGaN/GaN HEMT is realized which relaxes the electric field concentration around the gate electrode 7 by a relatively simple structure to suppress deterioration or breakdown of the device characteristics so as to achieve high withstand voltage and high output power.

Modification Example 2

Modification Example 2 is different from the first embodiment in that the shape of a part of a protective insulating film is different. Note that the same constituent members and so on as those of the AlGaN/GaN HEMT according to the first embodiment will be denoted by the same reference signs, and a detailed description thereof will be omitted.

Figure 13A:
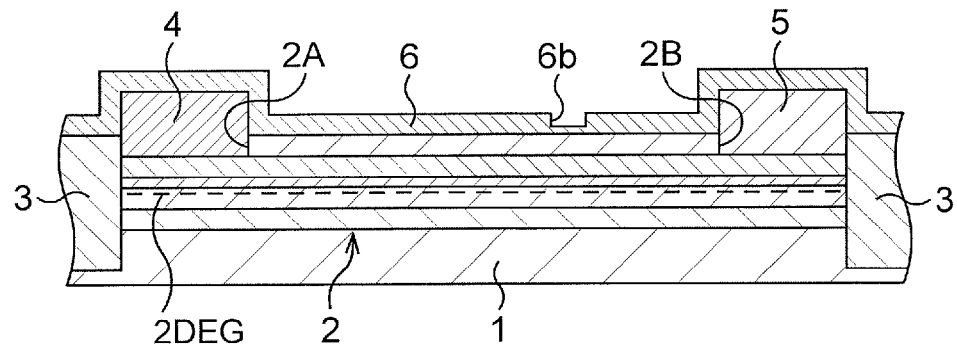
FIG. 13A to FIG. 13C are schematic cross-sectional views illustrating main processes in a method of manufacturing a Schottky-type AlGaN/GaN HEMT according to Modification Example 2 of the first embodiment.
Figure 13B:
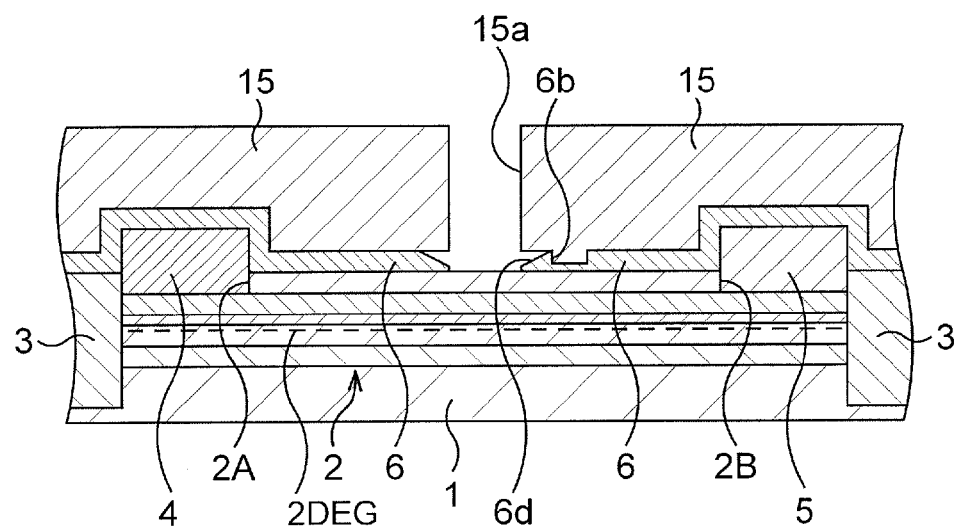
Figure 13C:
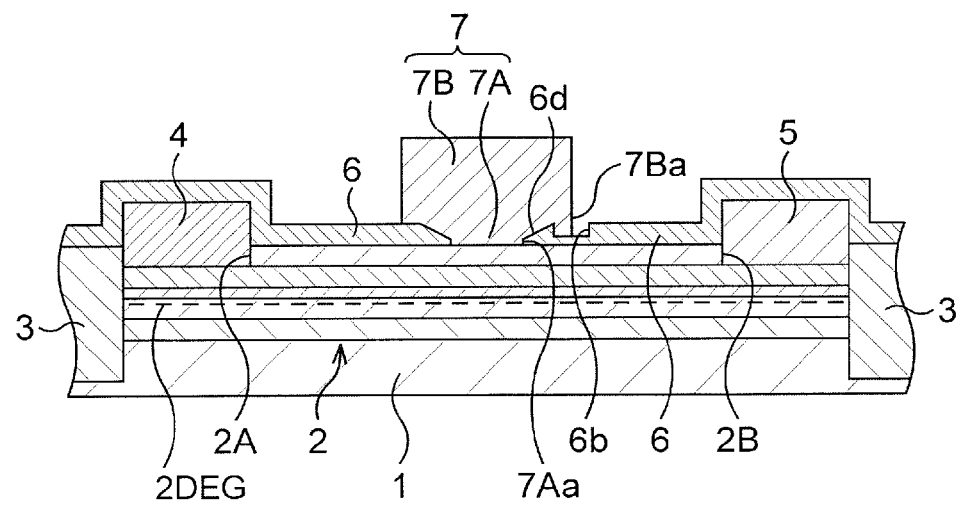

FIG. 13A to FIG. 13C are schematic cross-sectional views illustrating main processes in a method of manufacturing a Schottky-type AlGaN/GaN HEMT according to Modification Example 2 of the first embodiment.

First, through the processes in FIG. 1A to FIG. 2B of the first embodiment, a second trench 6b is formed in a protective insulating film 6 that covers the top of a compound semiconductor layer 2. The appearance in this event is illustrated in FIG. 13A.

Subsequently, as illustrated in FIG. 13B, a first trench 6d is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 15 having an opening 15a is formed.

Next, wet etching using the resist mask 15 is performed on the protective insulating film 6 until the surface of a cap layer 2e is exposed at the bottom of the opening 15a. For example, buffered hydrofluoric acid is used as an etchant. Thus, the first trench 6d that is a through trench exposing the surface of the cap layer 2e is formed in the protective insulating film 6. The first trench 6d is formed such that its side wall surface is formed into an inclined surface by the wet etching, the width of a bottom portion is about 600 nm, and an upper portion is wider than the bottom portion. With the first trench 6d, the protective insulating film 6 progressively decreases in thickness from the second trench 6b toward the first trench 6d at a site between the first trench 6d and the second trench 6b. The first trench 6d is formed at a formation scheduled site for a fine gate of a gate electrode to be formed at subsequent processes, side by side with the second trench 6b in the protective insulating film 6.

The resist mask 15 is removed by ashing using oxygen plasma or wet treatment using a chemical.

The case of forming the first trench 6d after forming the second trench 6b in the protective insulating film 6 is exemplified in FIG. 2B and FIG. 13B, but the order of processes may be inverted so that the second trench 6b may be formed after the first trench 6d is formed in the protective insulating film 6.

Subsequently, the processes in FIG. 3A to FIG. 3C of the first embodiment are performed. The state corresponding to FIG. 3C is illustrated in FIG. 13C.

A gate electrode 7 is in a so-called overhanging shape in which a fine gate 7A at a lower part fills the inside of the first trench 6d and is in Schottky contact with the surface of the compound semiconductor layer 2, and an over gate 7B at an upper part is formed wider than the fine gate 7A. In the gate electrode 7, one end (an electrode end on a drain electrode 5 side, defined as an OG end 7Ba) of the over gate 7B is located inside the second trench 6b. Specifically, the OG end 7Ba is formed at a site, inside the second trench 6b, away from an end portion on the gate electrode 7 side of the second trench 6b toward the drain electrode 5 by 0.2 μm or more, here about 0.2 μm.

Thereafter, through processes of electrical connection of a source electrode 4, the drain electrode 5, and the gate electrode 7 and so on, the Schottky-type AlGaN/GaN HEMT is formed.

Hereinafter, operations and effects that the AlGaN/GaN HEMT according to Modification Example 2 has will be described based on comparison with a comparative example.

Figure 14A:
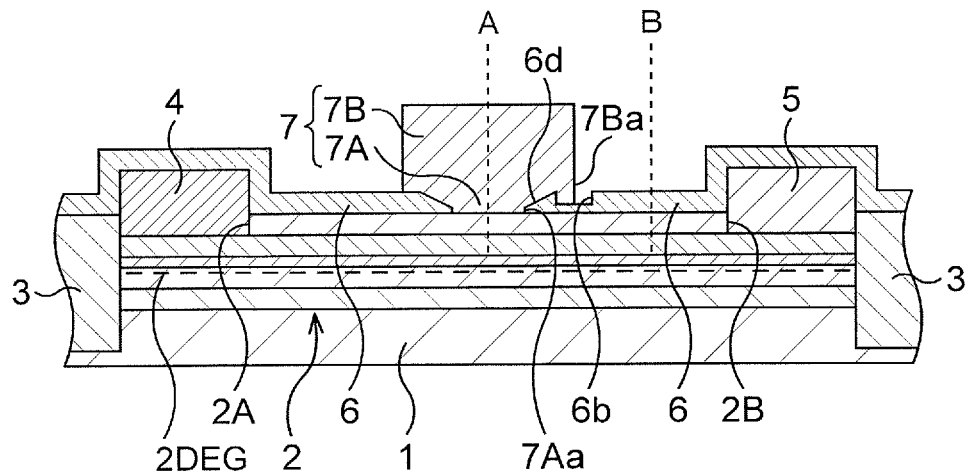
FIG. 14A and FIG. 14B are a view illustrating the AlGaN/GaN HEMT according to Modification Example 2 of the first embodiment and a chart presenting the intensity of an electric field applied to a region between a source and a drain thereof.
Figure 14B:
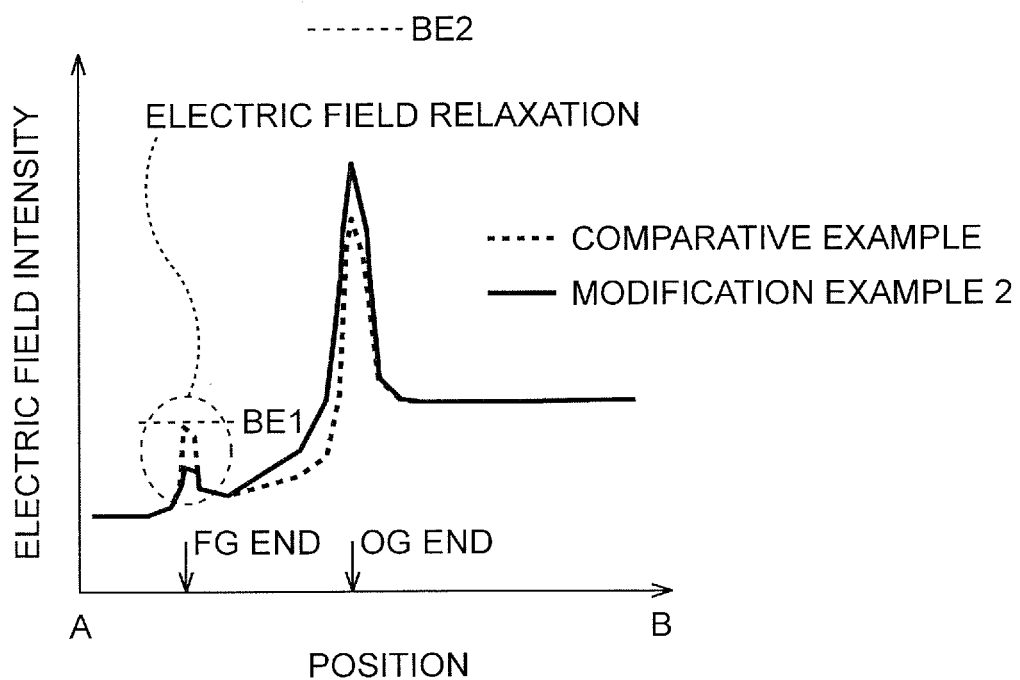

FIG. 14A and FIG. 14B are a view illustrating the AlGaN/GaN HEMT according to Modification Example 2 of this embodiment and a chart presenting the intensity of an electric field applied to a region between a source and a drain thereof. FIG. 14A is a schematic cross-sectional view of the AlGaN/GaN HEMT corresponding to FIG. 13C and FIG. 14B presents a characteristic chart of the electric field intensity. Note that the AlGaN/GaN HEMT in the comparative example is the same as that in FIG. 4A, and its characteristic chart of the electric field intensity is the same as that in FIG. 4B.

FIG. 14B presents the electric field intensity between a broken line A and a broken line B drawn in FIG. 14A, and also presents electric field intensities of breakdown limits of device characteristics at the FG end and the OG end due to electric field concentration. The electric field intensity of breakdown limit at the FG end is defined as BE1, and the electric field intensity of breakdown limit at the OG end is defined as BE2.

In the HEMT having the gate electrode in the overhanging shape, high electric fields concentrate on the FG end and the OG end. In this case, the device characteristics are likely to deteriorate or break down more at the FG end than at the OG end, so that BE1 is lower than BE2.

In the case of applying a predetermined drain voltage, the total amount of electric field generated around the gate electrode takes an almost constant predetermined value. As described above, the deterioration or breakdown of the device characteristics due to electric field concentration most possibly occurs at the FG end. In contrast, there is a margin with respect to the breakdown limit regarding the electric field concentration on the OG end. Further, an electric field intensity close to the breakdown limit is not found in a region between the FG end and the OG end. In Modification Example 2, focusing attention on this point, the electric field intensity at the OG end is aggressively increased to a limit not reaching the breakdown limit and the electric field intensity in the region between the FG end and the OG end is gradually increased to a limit not reaching the breakdown limit to relax the electric field concentration on the FG end by the increases. In other words, a part of the electric field intensity at the FG end is distributed to the OG end and the region between the FG end and the OG end. This relaxes the electric field concentration on the FG end which most possibly reaches the breakdown limit, thereby suppressing the deterioration or breakdown of the device characteristics due to the electric field concentration as a whole.

In the AlGaN/GaN HEMT according to Modification Example 2, the second trench 6b is formed in the protective insulating film 6, and the inclined surface is formed between the first trench 6d being a site where the fine gate 7A is to be formed and the second trench 6b. Thus, the protective insulating film 6 is reduced in thickness in the second trench 6b and progressively reduced in thickness from the second trench 6b toward the first trench 6d, so that a depletion layer gradually extends inside the compound semiconductor layer 2. As illustrated in FIG. 14B, the electric field intensity at the OG end 7Ba increases to a limit not reaching the breakdown limit and the electric field intensity in the region between the FG end 7Aa and the OG end 7Ba increases to a limit not reaching the breakdown limit and, along with this, the electric field intensity at the FG end 7Aa decreases to relax the electric field concentration. Thus, the electric field intensity at the FG end 7Aa becomes greatly lower than BE1 that is the breakdown limit. In Modification Example 2, since a contributory portion of the increase in the electric field intensity in the region between the FG end 7Aa and the OG end 7Ba is relatively large, the increase amount in the electric field intensity at the OG end 7Ba is lower than that in the first embodiment. As described above, the deterioration or breakdown of the device characteristics due to the electric field concentration is suppressed as a whole between the gate and the drain.

Figure 15A:
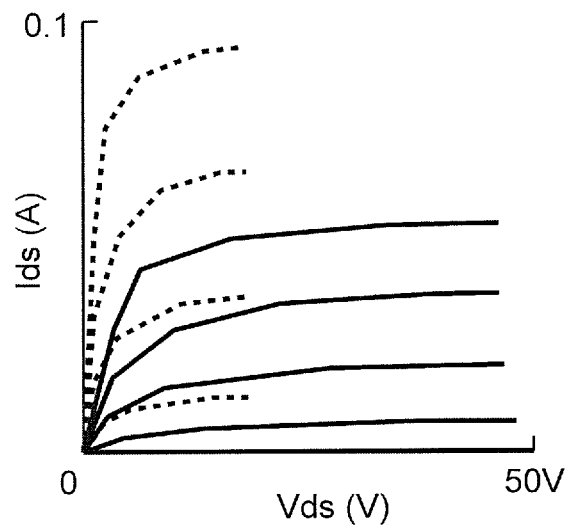
FIG. 15A and FIG. 15B are characteristic charts presenting results of three-terminal characteristics of the AlGaN/GaN HEMT according to Modification Example 2 of the first embodiment investigated based on comparison with the comparative example.
Figure 15B:
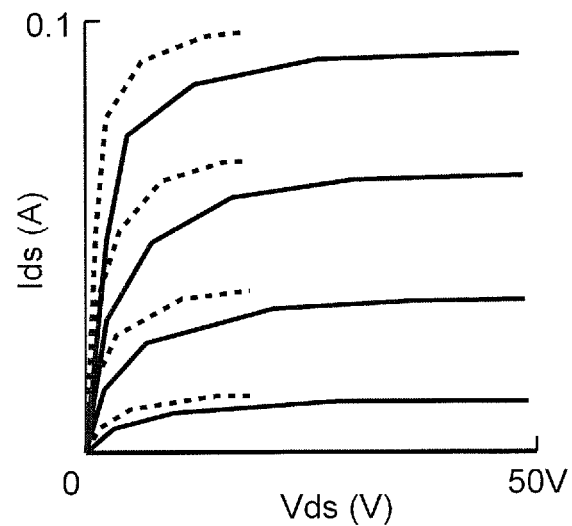

Three-terminal characteristics of the AlGaN/GaN HEMT according to Modification Example 2 were investigated based on comparison with the above comparative example. The results are presented in FIG. 15A and FIG. 15B. FIG. 15A presents the result of the comparative example, and FIG. 15B presents the result of Modification Example 2. Here, solid lines indicate IV characteristics at application of Vds=20 V, and broken lines indicate IV characteristics at application of Vds=50 V.

In FIG. 15B, improvement in current collapse was confirmed as compared to FIG. 15A. This means that the electric field concentration on the FG end was relaxed to suppress electron capture into an electron trap in Modification Example 2.

Figure 16:
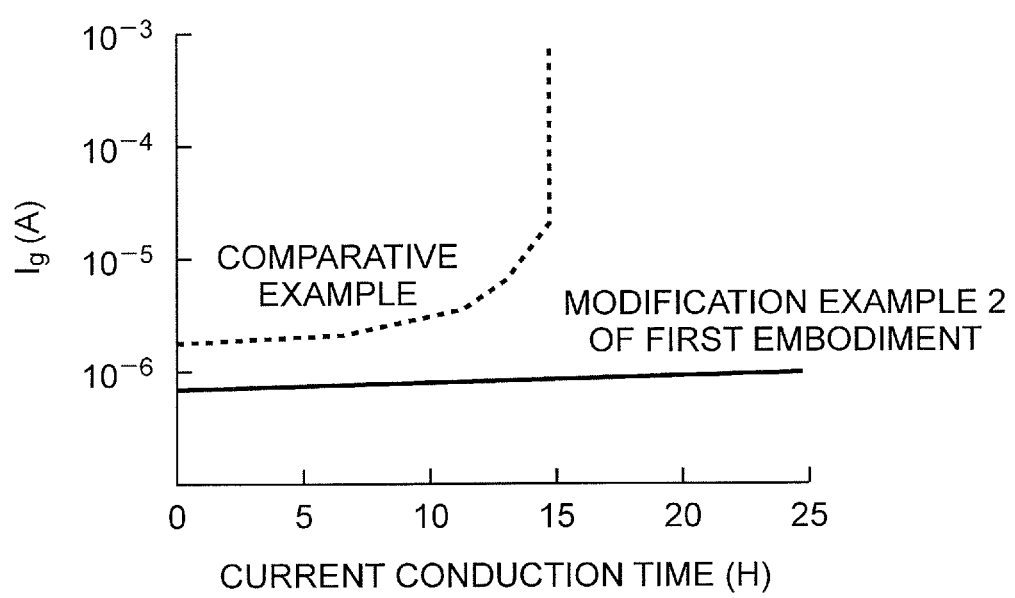
FIG. 16 is a characteristic chart presenting results of a high-temperature current conduction test carried out on the AlGaN/GaN HEMT according to Modification Example 2 of the first embodiment, based on comparison with the comparative example.

Further, a high-temperature current conduction test was carried out on the AlGaN/GaN HEMT according to Modification Example 2 based on comparison with the above comparative example. The results are presented in FIG. 16.

It was confirmed that, in Modification Example 2, the gate current less changed in the high-temperature current conduction test and no breakdown occurred unlike the comparative example. In other words, application of the protective insulating film 6 and the gate electrode 7 in Modification Example 2 realizes a highly reliable AlGaN/GaN HEMT with excellent output characteristics.

As described above, according to Modification Example 2, a highly reliable AlGaN/GaN HEMT is realized which relaxes the electric field concentration around the gate electrode 7 by a relatively simple structure to suppress deterioration or breakdown of the device characteristics so as to achieve high withstand voltage and high output power.

Modification Example 3

Modification Example 3 is different from the first embodiment in that a second trench formed in a protective insulating film and the shape of a part of the protective insulating film are different. Note that the same constituent members and so on as those of the AlGaN/GaN HEMT according to the first embodiment will be denoted by the same reference signs, and a detailed description thereof will be omitted.

FIG. 17A to FIG. 17C and FIG. 18 are schematic cross-sectional views illustrating main processes in a method of manufacturing a Schottky-type AlGaN/GaN HEMT according to Modification Example 3 of the first embodiment.

Figure 17A:
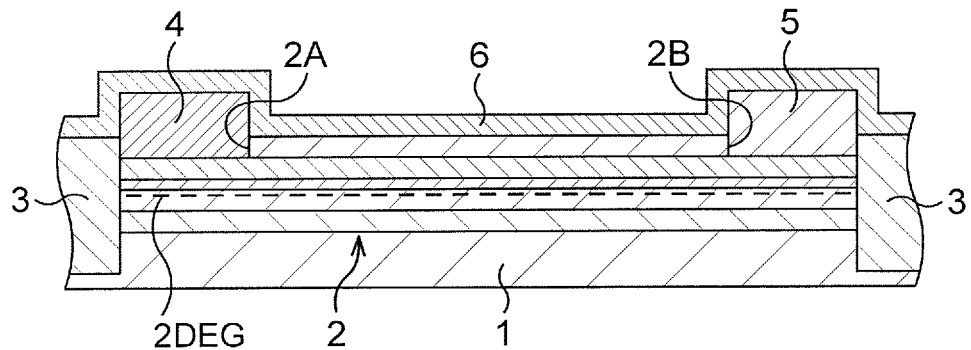
FIG. 17A to FIG. 17C are schematic cross-sectional views illustrating main processes in a method of manufacturing a Schottky-type AlGaN/GaN HEMT according to Modification Example 3 of the first embodiment.

First, through the processes in FIG. 1A to FIG. 2A of the first embodiment, a protective insulating film 6 that covers the top of a compound semiconductor layer 2 is formed. The appearance in this event is illustrated in FIG. 17A.

Figure 17B:
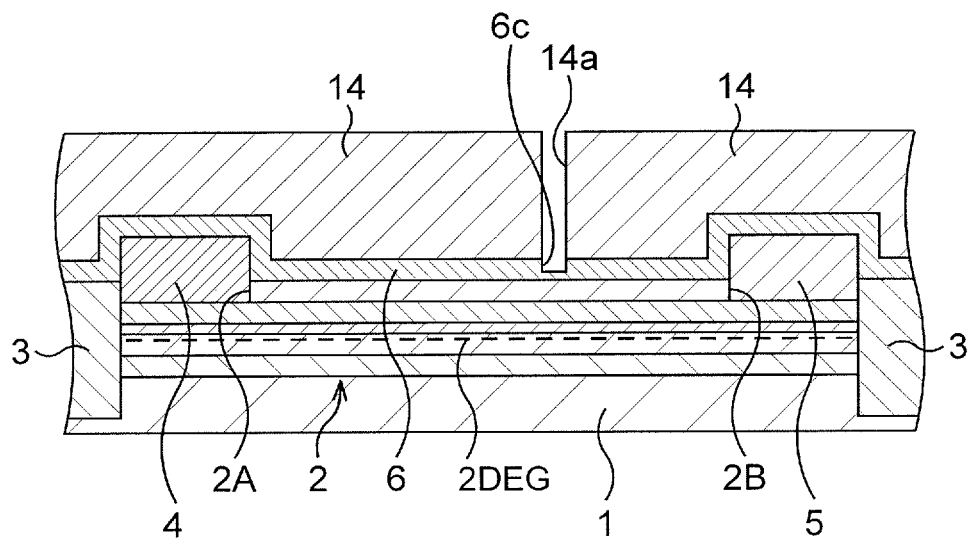

Subsequently, as illustrated in FIG. 17B, a second trench 6c is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 400 nm on the applied resist, and the resist is developed. For example, NMD-W (trade name) manufactured by Tokyo Ohka Kogyo Co., Ltd. is used as a developing solution. Thus, a resist mask 14 having an opening 14a is formed.

Next, dry etching using the resist mask 14 is performed on the protective insulating film 6 so that the protective insulating film 6 remains with only a predetermined thickness in the opening 14a.

For example, $SF_6$ is used as an etching gas. Thus, the second trench 6c having a width of about 400 nm and a depth of, for example, about 30 nm (the thickness of the remaining protective insulating film 6 is about 30 nm) is formed in the protective insulating film 6. The second trench 6c is formed at a site biased toward a drain electrode 5, here, a site where the whole trench is contained in an over gate of a gate electrode to be formed. A correct value of the depth of the second trench 6c is decided depending on a thickness of the protective insulating film 6, a dielectric breakdown withstand voltage of the protective insulating film 6, a potential difference between a drain voltage and a gate voltage, a peak value of swing of the gate voltage and so on.

The resist mask 14 is removed by ashing using oxygen plasma or wet treatment using a chemical.

Figure 17C:
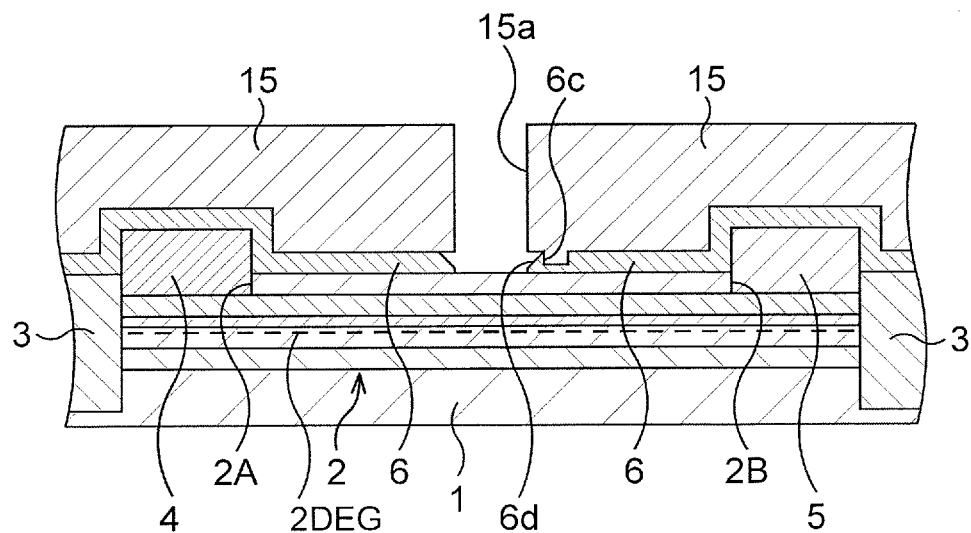

Subsequently, as illustrated in FIG. 17C, a first trench 6d is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 15 having an opening 15a is formed.

Next, wet etching using the resist mask 15 is performed on the protective insulating film 6 until the surface of a cap layer 2e is exposed at the bottom of the opening 15a. For example, buffered hydrofluoric acid is used as an etchant. Thus, the first trench 6d that is a through trench exposing the surface of the cap layer 2e is formed in the protective insulating film 6. The first trench 6d is formed such that its side wall surface is formed into an inclined surface by the wet etching, the width of a bottom portion is about 600 nm, and an upper portion is wider than the bottom portion. With the first trench 6d, the protective insulating film 6 progressively decreases in thickness from the second trench 6c toward the first trench 6d at a site between the first trench 6d and the second trench 6c. The first trench 6d is formed at a formation scheduled site for a fine gate of a gate electrode to be formed at subsequent processes, side by side with the second trench 6c in the protective insulating film 6.

The resist mask 15 is removed by ashing using oxygen plasma or wet treatment using a chemical.

The case of forming the first trench 6d after forming the second trench 6c in the protective insulating film 6 is exemplified in FIG. 17B and FIG. 17C, but the order of processes may be inverted so that the second trench 6c may be formed after the first trench 6d is formed in the protective insulating film 6.

Figure 18:
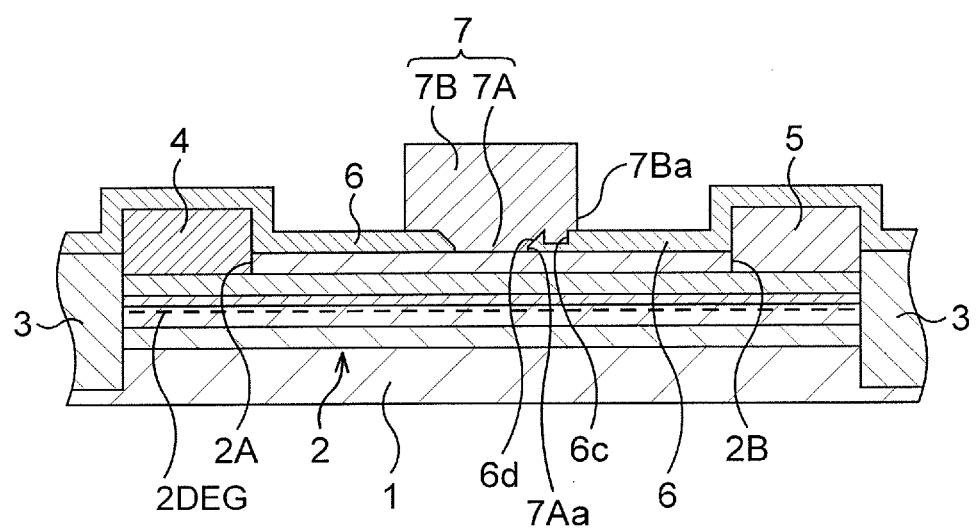
FIG. 18 is a schematic cross-sectional view, subsequent to FIG. 17A to FIG. 17C, illustrating a main process in the method of manufacturing the Schottky-type AlGaN/GaN HEMT according to Modification Example 3 of the first embodiment.

Subsequently, the processes in FIG. 3A to FIG. 3C of the first embodiment are performed. The state corresponding to FIG. 3C is illustrated in FIG. 18.

A gate electrode 7 is in an overhanging shape composed of a fine gate 7A at a lower part and an over gate 7B at an upper part wider than the fine gate 7A. The fine gate 7A fills the inside of the first trench 6d and is in Schottky contact with the surface of the compound semiconductor layer 2. The over gate 7B fills the inside of the second trench 6c and has an OG end 7Ba located at a site away from an end portion on a drain electrode 5 side of the second trench 6c toward the drain electrode 5 by about 0.1 μm.

Thereafter, through processes of electrical connection of a source electrode 4, the drain electrode 5, and the gate electrode 7 and so on, the Schottky-type AlGaN/GaN HEMT is formed.

Hereinafter, operations and effects that the Schottky-type AlGaN/GaN HEMT according to Modification Example 3 has will be described based on comparison with a comparative example.

Figure 19A:
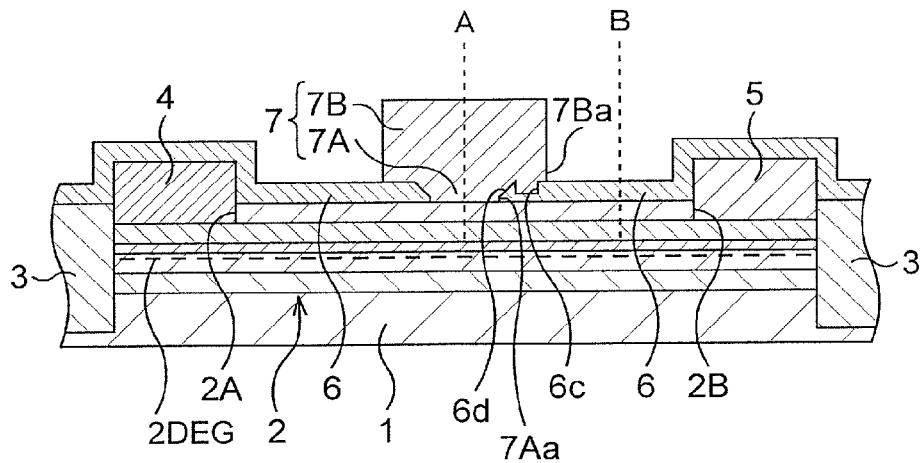
FIG. 19A and FIG. 19B are a view illustrating the AlGaN/GaN HEMT according to Modification Example 3 of the first embodiment and a chart presenting the intensity of an electric field applied to a region between a source and a drain thereof.
Figure 19B:
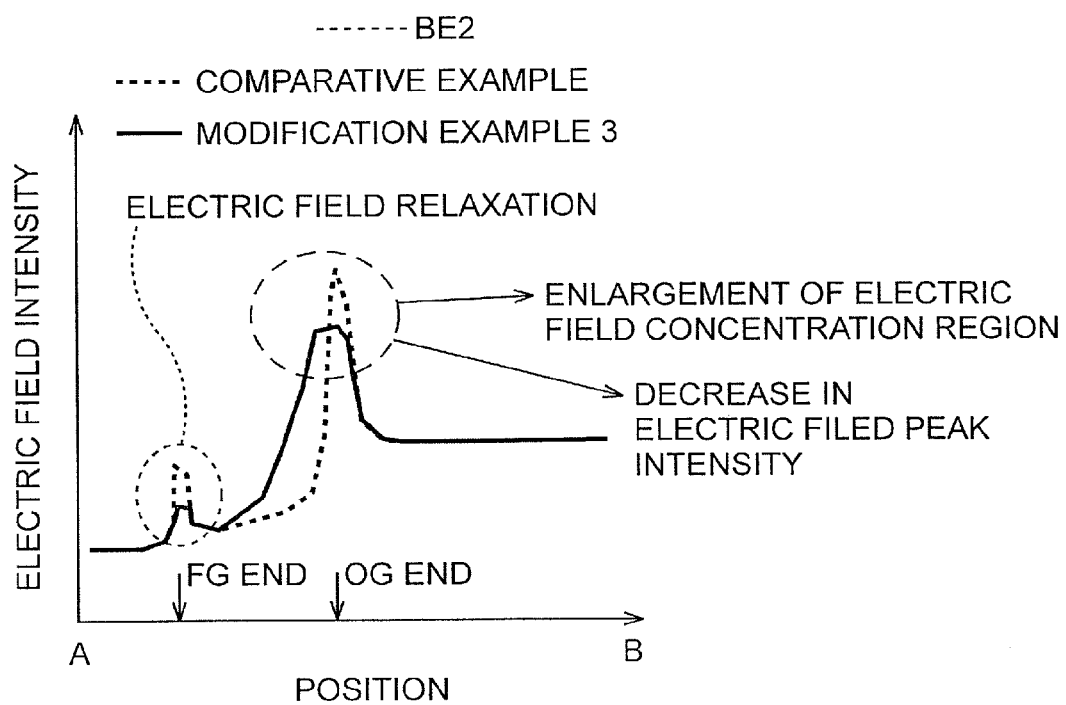

FIG. 19A and FIG. 19B are a view illustrating the Schottky-type AlGaN/GaN HEMT according to Modification Example 3 of this embodiment and a chart presenting the intensity of an electric field applied to a region between a source and a drain thereof. FIG. 19A is a schematic cross-sectional view of the AlGaN/GaN HEMT corresponding to FIG. 18, and FIG. 19B presents a characteristic chart of the electric field intensity. Note that the AlGaN/GaN HEMT in the comparative example is the same as that in FIG. 4A, and its characteristic chart of the electric field intensity is the same as that in FIG. 4B.

FIG. 19B presents the electric field intensity between a broken line A and a broken line B drawn in FIG. 19A, and also presents electric field intensities of breakdown limits of device characteristics at an FG end and an OG end due to electric field concentration. The electric field intensity of breakdown limit at the FG end is defined as BE1, and the electric field intensity of breakdown limit at the OG end is defined as BE2.

In the HEMT having the gate electrode in the overhanging shape, high electric fields concentrate on the FG end and the OG end. In this case, the device characteristics are likely to deteriorate or break down more at the FG end than at the OG end, so that BE1 is lower than BE2.

In the case of applying a predetermined drain voltage, the total amount of electric field generated around the gate electrode takes an almost constant predetermined value. As described above, the deterioration or breakdown of the device characteristics due to electric field concentration most possibly occurs at the FG end. In contrast, an electric field intensity close to the breakdown limit is not found in a region between the FG end and the OG end. In Modification Example 3, focusing attention on this point, the electric field intensity in the region between the FG end and the OG end is gradually increased to a limit not reaching the breakdown limit to relax the electric field concentration on the FG end by the increase. In other words, a part of the electric field intensity at the FG end is distributed to the region between the FG end and the OG end. This relaxes the electric field concentration on the FG end which most possibly reaches the breakdown limit, thereby suppressing the deterioration or breakdown of the device characteristics due to the electric field concentration as a whole.

In the AlGaN/GaN HEMT according to Modification Example 3, the second trench 6c is formed in the protective insulating film 6, and the inclined surface is formed between the first trench 6d being a site where the fine gate 7A is to be formed and the second trench 6c. Thus, the protective insulating film 6 is reduced in thickness in the second trench 6c and progressively reduced in thickness from the second trench 6c toward the first trench 6d. The gate electrode 7 is formed so that the over gate 7B fills and contains an inclined surface portion of the protective insulating film 6 and the second trench 6c where the protective insulating film 6 is thin. With this structure, a depletion layer in the compound semiconductor layer 2 gradually extends. As illustrated in FIG. 19B, the electric field intensity in the region between the FG end 7Aa and the OG end 7Ba gradually increases to a limit not reaching the breakdown limit and, along with this, the electric field intensity at the FG end 7Aa decreases to relax the electric field concentration. Thus, the electric field intensity at the FG end 7Aa becomes greatly lower than BE1 that is the breakdown limit. In Modification Example 3, since a contributory portion of the increase in the electric field intensity in the region between the FG end 7Aa and the OG end 7Ba is larger than those in Modification Examples 1, 2, the electric field intensity at the FG end 7Aa is lower than that in Modification Example 2 and the electric field intensity at the OG end 7Ba is lower than that in Modification Example 1. As described above, the deterioration or breakdown of the device characteristics due to the electric field concentration is suppressed as a whole between the gate and the drain.

Figure 20A:
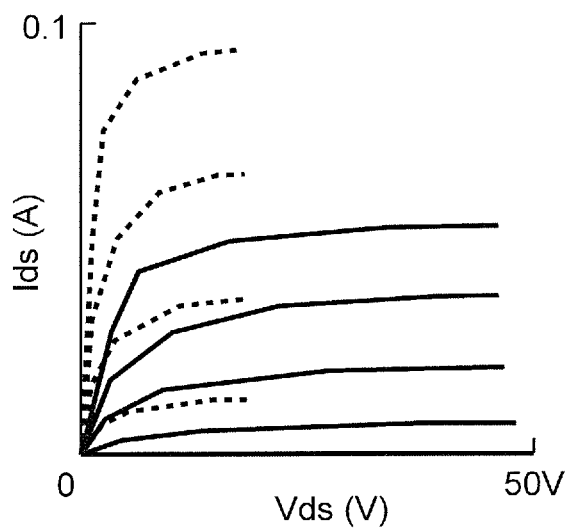
FIG. 20A and FIG. 20B are characteristic charts presenting results of three-terminal characteristics of the AlGaN/GaN HEMT according to Modification Example 3 of the first embodiment investigated based on comparison with the comparative example.
Figure 20B:
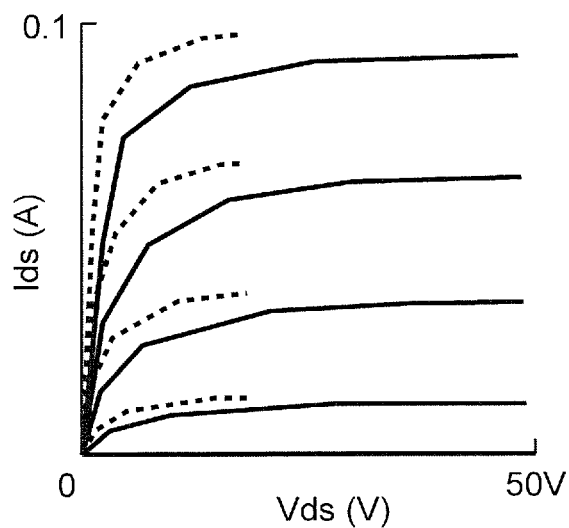

Three-terminal characteristics of the AlGaN/GaN HEMT according to Modification Example 3 were investigated based on comparison with the above comparative example. The results are presented in FIG. 20A and FIG. 20B. FIG. 20A presents the result of the comparative example, and FIG. 20B presents the result of Modification Example 3. Here, solid lines indicate IV characteristics at application of Vds=20 V, and broken lines indicate IV characteristics at application of Vds=50 V.

In FIG. 20B, improvement in current collapse was confirmed as compared to FIG. 20A. This means that the electric field concentration on the FG end was relaxed to suppress electron capture into an electron trap in Modification Example 3.

Figure 21:
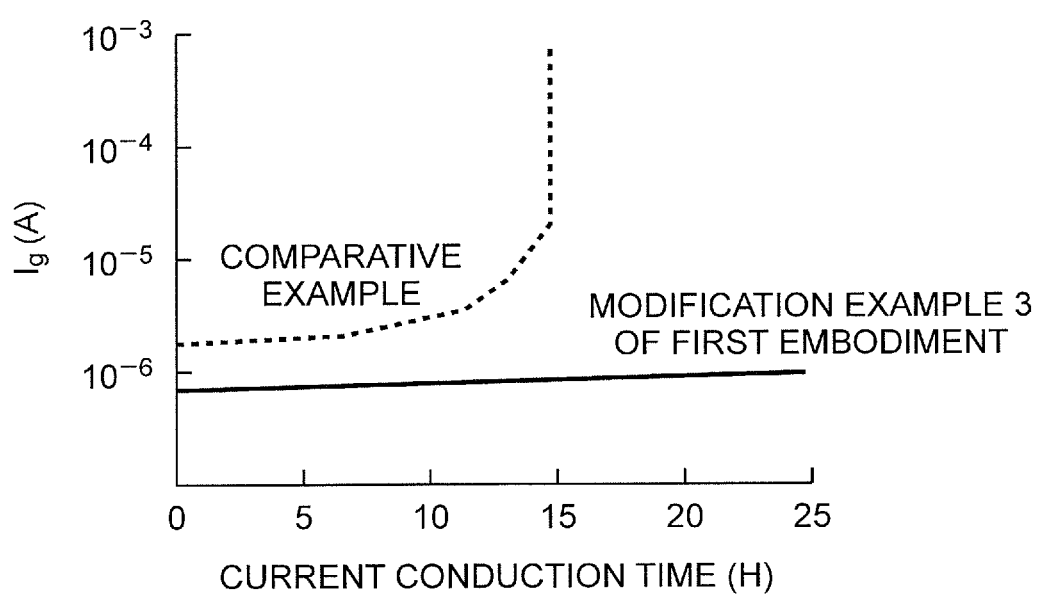
FIG. 21 is a characteristic chart presenting results of a high-temperature current conduction test carried out on the AlGaN/GaN HEMT according to Modification Example 3 of the first embodiment, based on comparison with the comparative example.

Further, a high-temperature current conduction test was carried out on the AlGaN/GaN HEMT according to Modification Example 3 based on comparison with the above comparative example. The results are presented in FIG. 21.

It was confirmed that, in Modification Example 3, the gate current less changed in the high-temperature current conduction test and no breakdown occurred unlike the comparative example. In other words, application of the protective insulating film 6 and the gate electrode 7 in Modification Example 3 realizes a highly reliable AlGaN/GaN HEMT with excellent output characteristics.

As described above, according to Modification Example 3, a highly reliable AlGaN/GaN HEMT is realized which relaxes the electric field concentration around the gate electrode 7 by a relatively simple structure to suppress deterioration or breakdown of the device characteristics so as to achieve high withstand voltage and high output power.

Second Embodiment

Hereinafter, a MIS-type AlGaN/GaN HEMT according to a second embodiment will be described. This embodiment is different from the first embodiment in that a gate insulating film is formed in the AlGaN/GaN HEMT of the first embodiment. Note that the same constituent members and so on as those of the AlGaN/GaN HEMT according to the first embodiment will be denoted by the same reference signs, and a detailed description thereof will be omitted.

Figure 22A:
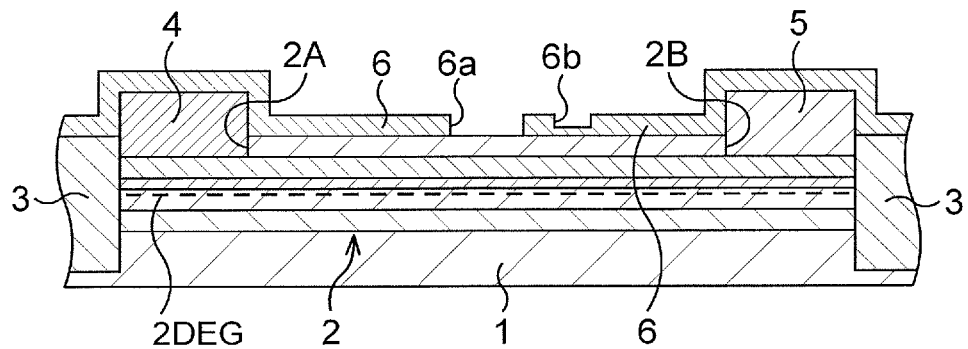
FIG. 22A to FIG. 22C are schematic cross-sectional views illustrating main processes in a method of manufacturing a MIS-type AlGaN/GaN HEMT according to a second embodiment.
Figure 22B:
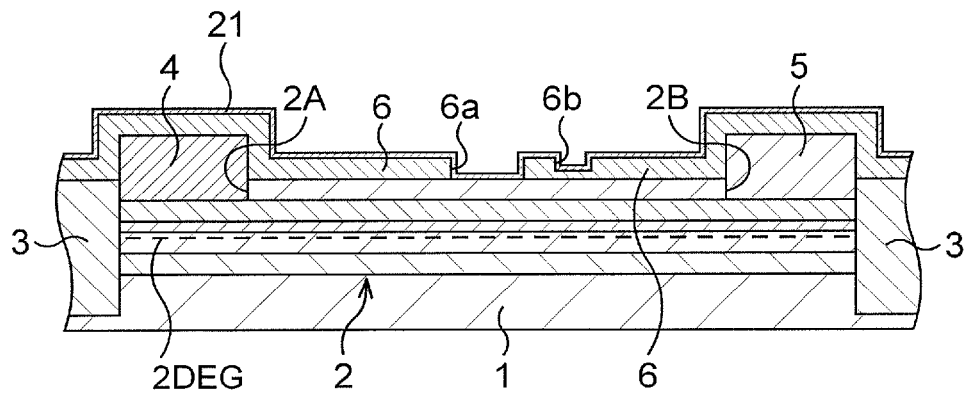
Figure 22C:
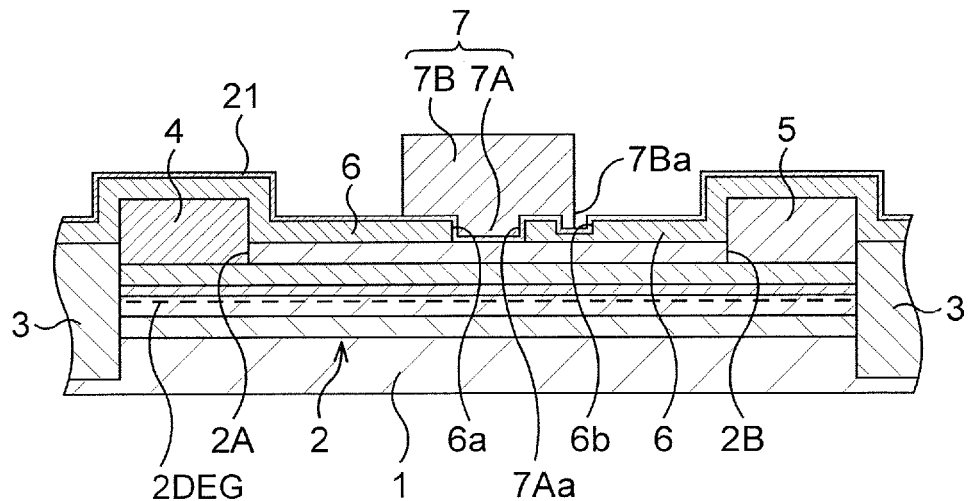

FIG. 22A to FIG. 22C are schematic cross-sectional views illustrating main processes in a method of manufacturing the MIS-type AlGaN/GaN HEMT according to the second embodiment.

First, through the processes in FIG. 1A to FIG. 2C of the first embodiment, a first trench 6a and a second trench 6b are formed in a protective insulating film 6 that covers the top of a compound semiconductor layer 2. The appearance in this event is illustrated in FIG. 22A.

Subsequently, as illustrated in FIG. 22B, a gate insulating film 21 that covers the inside of the first trench 6a is formed.

More specifically, the gate insulating film 21 is formed on the protective insulating film 6 in a manner to cover the inside of the first trench 6a. For example, $Al_2O_3$ is deposited to a thickness of about (20) nm by an atomic layer deposition method, ALD method. Thus, the gate insulating film 21 is formed.

Incidentally, for the deposition of $Al_2O_3$, a plasma CVD method, a sputtering method, or the like, for instance, may be used instead of the ALD method. Further, instead of depositing $Al_2O_3$, a nitride or an oxynitride of Al may be used. Besides, an oxide, a nitride, an oxynitride of Si, Hf, Zr, Ti, Ta, or W or a multilayer of appropriately selected ones from among these may be deposited to form the gate insulating film.

The gate insulating film 21 is formed on the protective insulating film 6 and therefore formed to cover also the inside of the second trench 6b. Accordingly, the insulator is increased in thickness by the gate insulating film 21 in the second trench 6b. In this embodiment, taking into consideration of this point, the thickness remaining at the bottom of the second trench 6b is reduced in the process in FIG. 2B by the effective thickness (the thickness converted into the protective insulating film 6) expected thereafter in the formation of the gate insulating film 21.

Subsequently, the processes in FIG. 3A to FIG. 3C of the first embodiment are performed. The state corresponding to FIG. 3C is illustrated in FIG. 22C.

A gate electrode 7 is in a so-called overhanging shape in which a fine gate 7A at a lower part fills the inside of the first trench 6d via the gate insulating film 21 and an over gate 7B at an upper part is formed wider than the fine gate 7A. In the gate electrode 7, one end (an electrode end on a drain electrode 5 side, defined as an OG end 7Ba) of the over gate 75 is located inside the second trench 6b via the gate insulating film 21. Specifically, the OG end 7Ba is formed at a site, inside the second trench 6b, away from an end portion on the gate electrode 7 side of the second trench 6b toward the drain electrode 5 by 0.2 µm or more.

Thereafter, through processes of electrical connection of a source electrode 4, the drain electrode 5, and the gate electrode 7 and so on, the MIS-type AlGaN/GaN HEMT is formed.

As described above, according to this embodiment, a highly reliable AlGaN/GaN HEMT is realized which relaxes the electric field concentration around the gate electrode 7 by a relatively simple structure to suppress deterioration or breakdown of the device characteristics so as to achieve high withstand voltage and high output power, as in the first embodiment.

MODIFICATION EXAMPLES

Hereinafter, modification examples of the MIS-type AlGaN/GaN HEMT according to the second embodiment will be described.

Modification Example 1

Modification Example 1 has a structure in which a gate insulating film is formed in the AlGaN/GaN HEMT according to Modification Example 1 of the first embodiment. Note that the same constituent members and so on as those of the AlGaN/GaN HEMT according to the first embodiment or the like will be denoted by the same reference signs, and a detailed description thereof will be omitted.

Figure 23A:
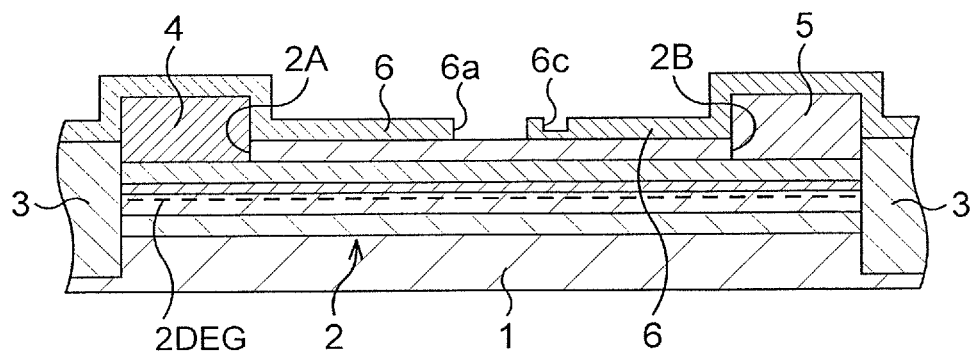
FIG. 23A to FIG. 23C are schematic cross-sectional views illustrating main processes in a method of manufacturing a MIS-type AlGaN/GaN HEMT according to Modification Example 1 of the second embodiment.
Figure 23B:
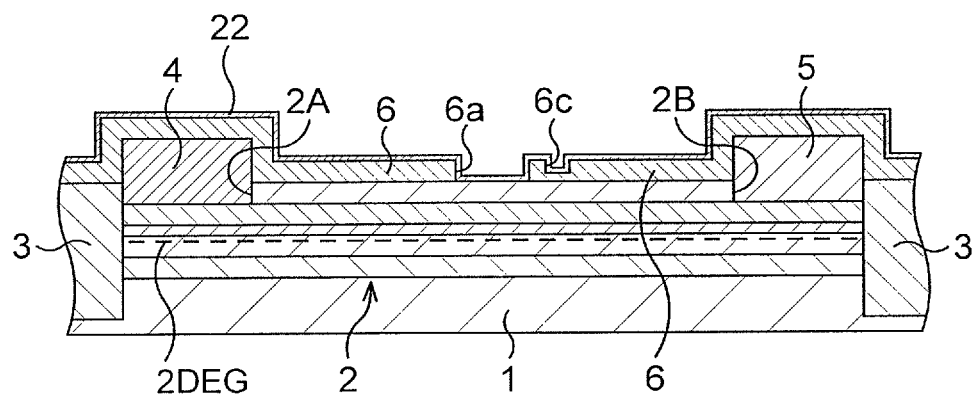
Figure 23C:
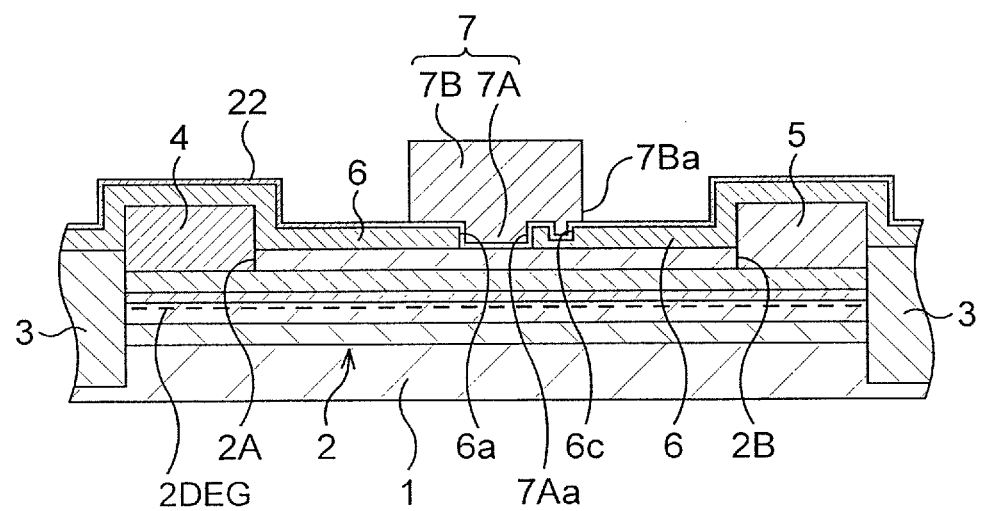

FIG. 23A to FIG. 23C are schematic cross-sectional views illustrating main processes in a method of manufacturing a MIS-type AlGaN/GaN HEMT according to Modification Example 1 of the second embodiment.

First, through the processes in FIG. 1A to FIG. 2A and FIG. 8B to FIG. 8C of the first embodiment, a first trench 6a and a second trench 6c are formed in a protective insulating film 6 that covers the whole surface of a compound semiconductor layer 2. The appearance in this event is illustrated in FIG. 23A.

Subsequently, as illustrated in FIG. 23B, a gate insulating film 22 that covers the inside of the first trench 6a is formed.

More specifically, the gate insulating film 22 is formed on the protective insulating film 6 in a manner to cover the inside of the first trench 6a. For example, $Al_2O_3$ is deposited to a thickness of about 20 nm by an ALD method. Thus, the gate insulating film 22 is formed.

Incidentally, for the deposition of $Al_2O_3$, a plasma CVD method, a sputtering method, or the like, for instance, may be used instead of the ALD method. Further, instead of depositing $Al_2O_3$, a nitride or an oxynitride of Al may be used. Besides, an oxide, a nitride, an oxynitride of Si, Hf, Zr, Ti, Ta, or W or a multilayer of appropriately selected ones from among these may be deposited to form the gate insulating film.

The gate insulating film 22 is formed on the protective insulating film 6 and therefore formed to cover also the inside of the second trench 6c. Accordingly, the insulator is increased in thickness by the gate insulating film 22 in the second trench 6c. In this embodiment, taking into consideration of this point, the thickness remaining at the bottom of the second trench 6c is reduced in the process in FIG. 8B by the effective thickness (the thickness converted into the protective insulating film 6) expected thereafter in the formation of the gate insulating film 22.

Subsequently, the processes in FIG. 3A to FIG. 3C of the first embodiment are performed. The state corresponding to FIG. 3C is illustrated in FIG. 23C.

A gate electrode 7 is in an overhanging shape composed of a fine gate 7A at a lower part and an over gate 7B at an upper part wider than the fine gate 7A. The fine gate 7A fills the inside of the first trench 6a via the gate insulating film 22. The over gate 7B fills the inside of the second trench 6c via the gate insulating film 22 and has an OG end 7Ba located at a site away from an end portion on a drain electrode 5 side of the second trench 6c toward the drain electrode 5 by about 0.1 µm.

Thereafter, through processes of electrical connection of a source electrode 4, the drain electrode 5, and the gate electrode 7 and so on, the MIS-type AlGaN/GaN HEMT is formed.

As described above, according to Modification Example 1, the electric field concentration around the gate electrode 7 is relaxed by a relatively simple structure to suppress deterioration or breakdown of the device characteristics as in Modification Example 1 of the first embodiment. This realizes a highly reliable AlGaN/GaN HEMT which achieves high withstand voltage and high output power.

Modification Example 2

Modification Example 2 has a structure in which a gate insulating film is formed in the AlGaN/GaN HEMT according to Modification Example 2 of the first embodiment. Note that the same constituent members and so on as those of the AlGaN/GaN HEMT according to the first embodiment or the like will be denoted by the same reference signs, and a detailed description thereof will be omitted.

Figure 24A:
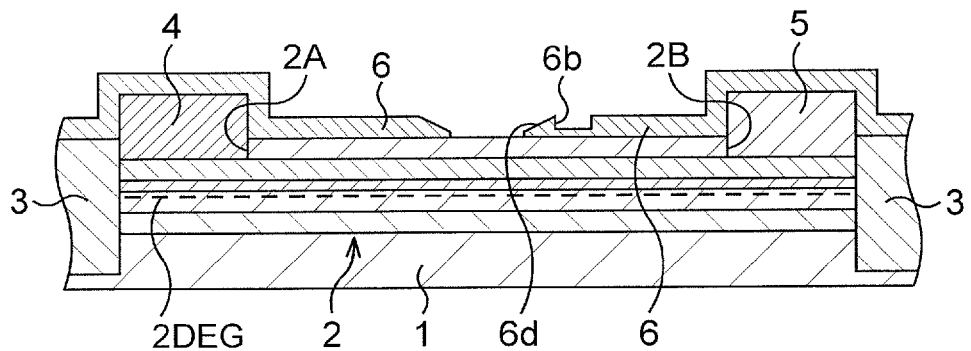
FIG. 24A to FIG. 24C are schematic cross-sectional views illustrating main processes in a method of manufacturing a MIS-type AlGaN/GaN HEMT according to Modification Example 2 of the second embodiment.
Figure 24B:
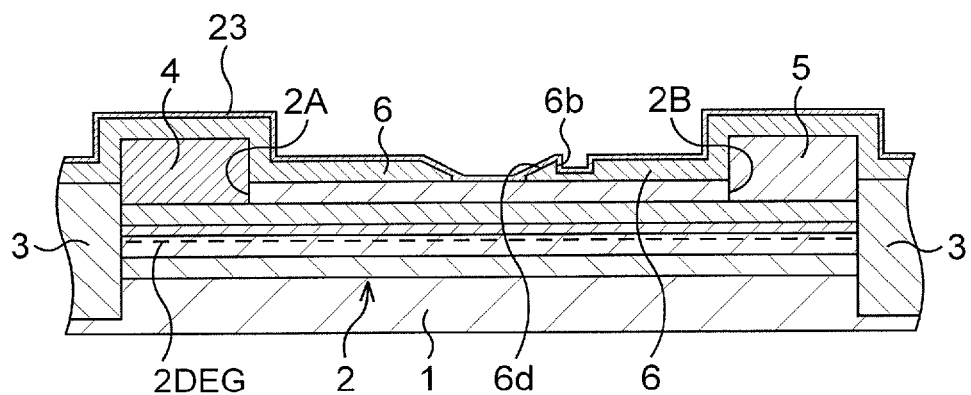
Figure 24C:
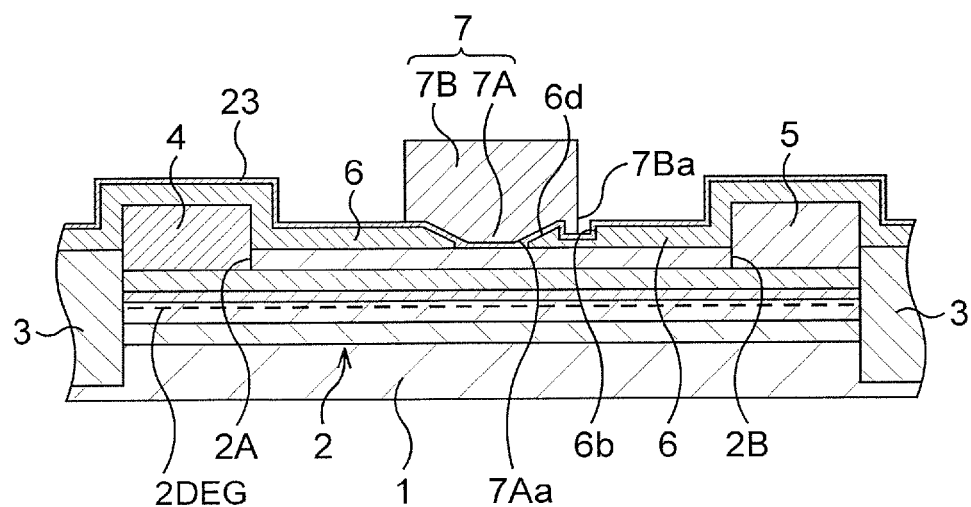

FIG. 24A to FIG. 24C are schematic cross-sectional views illustrating main processes in a method of manufacturing a MIS-type AlGaN/GaN HEMT according to Modification Example 2 of the second embodiment.

First, through the processes in FIG. 1A to FIG. 2B of the first embodiment and FIG. 13B in Modification Example 2 of the first embodiment, a first trench 6d and a second trench 6b are formed in a protective insulating film 6 that covers the whole surface of a compound semiconductor layer 2. The appearance in this event is illustrated in FIG. 24A.

Subsequently, as illustrated in FIG. 24B, a gate insulating film 23 that covers the inside of the first trench 6d is formed.

More specifically, the gate insulating film 23 is formed on the protective insulating film 6 in a manner to cover the inside of the first trench 6d. For example, $Al_2O_3$ is deposited to a thickness of about 20 nm by an atomic layer deposition method, ALD method. Thus, the gate insulating film 23 is formed.

Incidentally, for the deposition of $Al_2O_3$, a plasma CVD method, a sputtering method, or the like, for instance, may be used instead of the ALD method. Further, instead of depositing $Al_2O_3$, a nitride or an oxynitride of Al may be used. Besides, an oxide, a nitride, an oxynitride of Si, Hf, Zr, Ti, Ta, or W or a multilayer of appropriately selected ones from among these may be deposited to form the gate insulating film.

The gate insulating film 23 is formed on the protective insulating film 6 and therefore formed to cover also the inside of the second trench 6b. Accordingly, the insulator is increased in thickness by the gate insulating film 23 in the second trench 6b. In this embodiment, taking into consideration of this point, the thickness remaining at the bottom of the second trench 6b is reduced in the process in FIG. 2B by the effective thickness (the thickness converted into the protective insulating film 6) expected thereafter in the formation of the gate insulating film 23.

Subsequently, the processes in FIG. 3A to FIG. 3C of the first embodiment are performed. The state corresponding to FIG. 3C is illustrated in FIG. 24C.

A gate electrode 7 is in a so-called overhanging shape in which a fine gate 7A at a lower part fills the inside of the first trench 6d via the gate insulating film 23 and an over gate 7B at an upper part is formed wider than the fine gate 7A. In the gate electrode 7, one end (an electrode end on a drain electrode 5 side, defined as an OG end 7Ba) of the over gate 7B is located inside the second trench 6b via the gate insulating film 23. Specifically, the OG end 7Ba is formed at a site, inside the second trench 6b, away from an end portion on the gate electrode 7 side of the second trench 6b toward the drain electrode 5 by 0.2 μm or more, here about 0.2 μm.

Thereafter, through processes of electrical connection of a source electrode 4, the drain electrode 5, and the gate electrode 7 and so on, the MIS-type AlGaN/GaN HEMT is formed.

As described above, according to Modification Example 2, the electric field concentration around the gate electrode 7 is relaxed by a relatively simple structure to suppress deterioration or breakdown of the device characteristics as in Modification Example 2 of the first embodiment. This realizes a highly reliable AlGaN/GaN HEMT which achieves high withstand voltage and high output power.

Modification Example 3

Modification Example 3 has a structure in which a gate insulating film is formed in the AlGaN/GaN HEMT according to Modification Example 3 of the first embodiment. Note that the same constituent members and so on as those of the AlGaN/GaN HEMT according to the first embodiment or the like will be denoted by the same reference signs, and a detailed description thereof will be omitted.

Figure 25A:
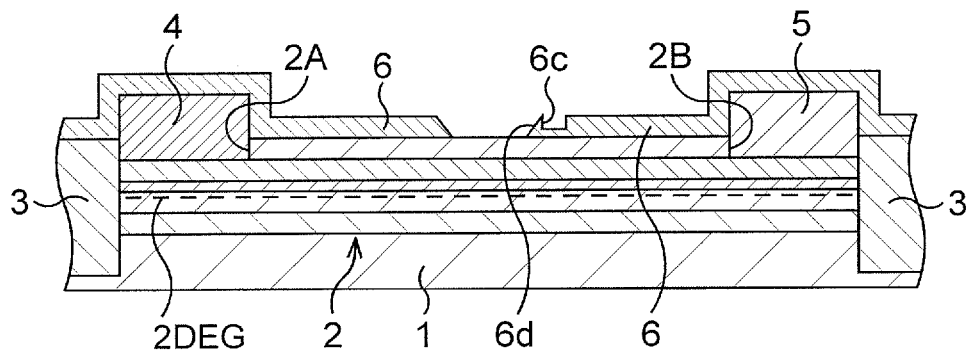
FIG. 25A to FIG. 25C are schematic cross-sectional views illustrating main processes in a method of manufacturing a MIS-type AlGaN/GaN HEMT according to Modification Example 3 of the second embodiment.
Figure 25B:
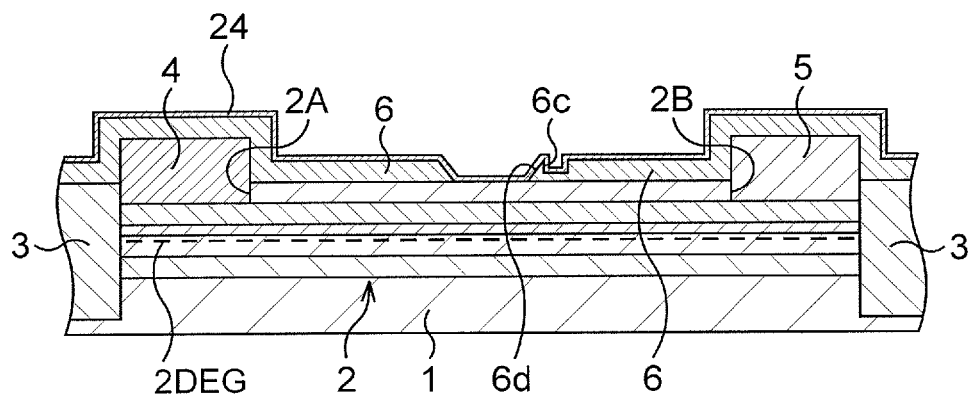
Figure 25C:
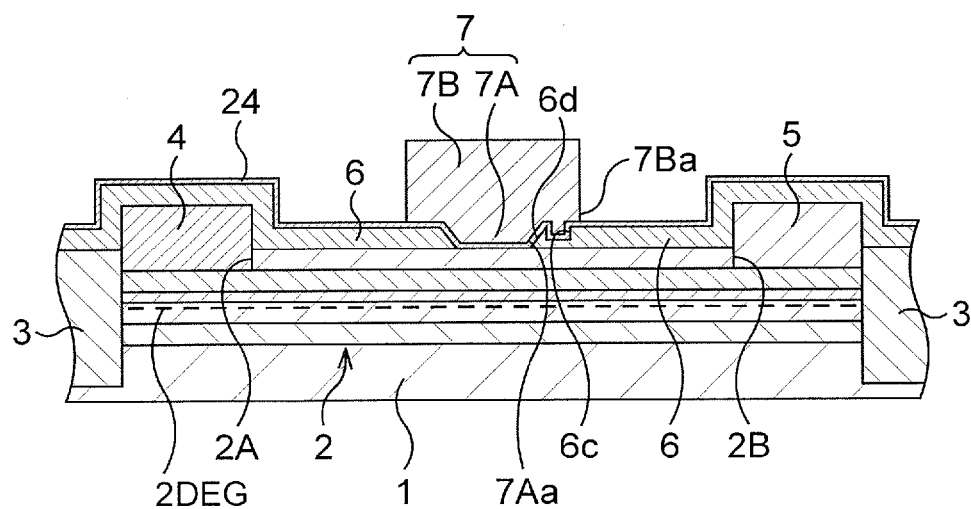

FIG. 25A to FIG. 25C are schematic cross-sectional views illustrating main processes in a method of manufacturing a MIS-type AlGaN/GaN HEMT according to Modification Example 3 of the second embodiment.

First, through the processes in FIG. 1A to FIG. 2A of the first embodiment and FIG. 17B to FIG. 17C in Modification Example 3 of the first embodiment, a first trench 6d and a second trench 6c are formed in a protective insulating film 6 that covers the whole surface of a compound semiconductor layer 2. The appearance in this event is illustrated in FIG. 25A.

Subsequently, as illustrated in FIG. 25B, a gate insulating film 24 that covers the inside of the first trench 6d is formed.

More specifically, the gate insulating film 24 is formed on the protective insulating film 6 in a manner to cover the inside of the first trench 6d. For example, $Al_2O_3$ is deposited to a thickness of about 20 nm by an atomic layer deposition method, ALD method. Thus, the gate insulating film 24 is formed.

Incidentally, for the deposition of $Al_2O_3$, a plasma CVD method, a sputtering method, or the like, for instance, may be used instead of the ALD method. Further, instead of depositing $Al_2O_3$, a nitride or an oxynitride of Al may be used. Besides, an oxide, a nitride, an oxynitride of Si, Hf, Zr, Ti, Ta, or W or a multilayer of appropriately selected ones from among these may be deposited to form the gate insulating film.

The gate insulating film 24 is formed on the protective insulating film 6 and therefore formed to cover also the inside of the second trench 6c. Accordingly, the insulator is increased in thickness by the gate insulating film 24 in the second trench 6c. In this embodiment, taking into consideration of this point, the thickness remaining at the bottom of the second trench 6c is reduced in the process in FIG. 17B by the effective thickness (the thickness converted into the protective insulating film 6) expected thereafter in the formation of the gate insulating film 24.

Subsequently, the processes in FIG. 3A to FIG. 3C of the first embodiment are performed. The state corresponding to FIG. 3C is illustrated in FIG. 25C.

A gate electrode 7 is in an overhanging shape composed of a fine gate 7A at a lower part and an over gate 7B at an upper part wider than the fine gate 7A. The fine gate 7A fills the inside of the first trench 6d via the gate insulating film 24. The over gate 7B fills the inside of the second trench 6c via the gate insulating film 24 and has an OG end 7Ba located at a site away from an end portion on a drain electrode 5 side of the second trench 6c toward the drain electrode 5 by about 0.1 μm.

Thereafter, through processes of electrical connection of a source electrode 4, the drain electrode 5, and the gate electrode 7 and so on, the MIS-type AlGaN/GaN HEMP is formed.

As described above, according to Modification Example 3, the electric field concentration around the gate electrode 7 is relaxed by a relatively simple structure to suppress deterioration or breakdown of the device characteristics as in Modification Example 3 of the first embodiment. This realizes a highly reliable AlGaN/GaN HEMT which achieves high withstand voltage and high output power.

Third Embodiment

Hereinafter, a MIS-type AlGaN/GaN HEMT according to a third embodiment will be described. This embodiment is different from the first embodiment in that a gate insulating film is formed in the AlGaN/GaN HEMT of the first embodiment. Note that the same constituent members and so on as those of the AlGaN/GaN HEMT according to the first embodiment will be denoted by the same reference signs, and a detailed description thereof will be omitted.

Figure 26A:
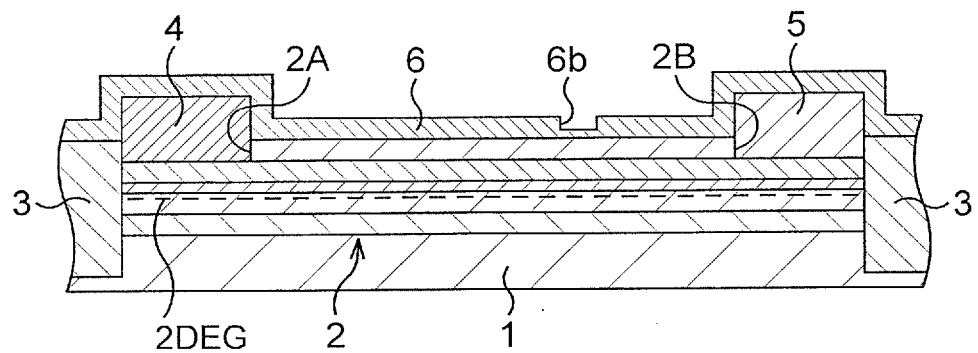
FIG. 26A to FIG. 26C are schematic cross-sectional views illustrating main processes in a method of manufacturing a MIS-type AlGaN/GaN HEMT according to a third embodiment.
Figure 26B:
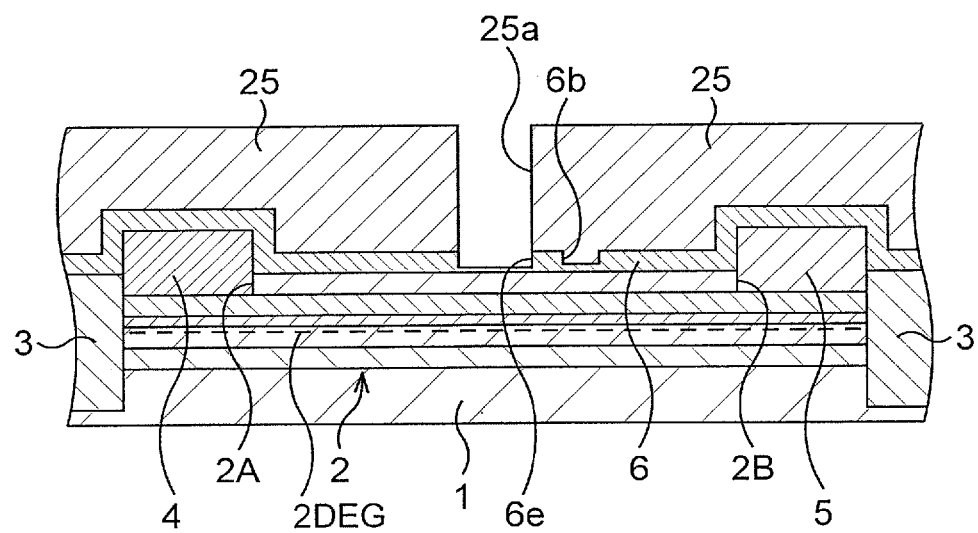
Figure 26C:
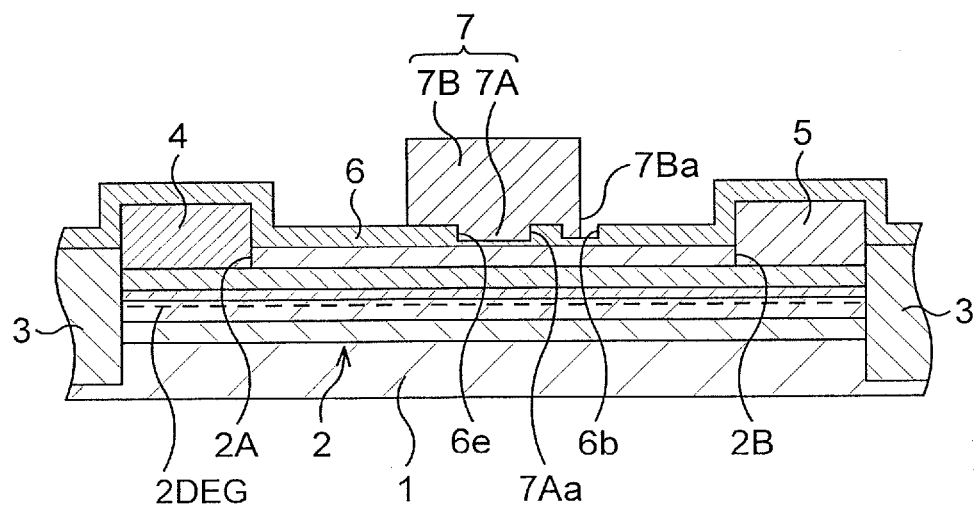

FIG. 26A to FIG. 26C are schematic cross-sectional views illustrating main processes in a method of manufacturing the MIS-type AlGaN/GaN HEMT according to the third embodiment.

First, through the processes in FIG. 1A to FIG. 2B of the first embodiment, a second trench 6b is formed in a protective insulating film 6 that covers the top of a compound semiconductor layer 2. The appearance in this event is illustrated in FIG. 26A.

Subsequently, as illustrated in FIG. 26B, a first trench 6e is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 25 having an opening 25a is formed.

Next, dry etching using the resist mask 25 is performed on the protective insulating film 6 so that the protective insulating film 6 remains with only a predetermined thickness at the bottom of the opening 25a. The remaining portion of the protective insulating film 6 serves as a gate insulating film, and therefore the predetermined thickness is set to, for example, about 20 nm. For example, $SF_6$ is used as an etching gas. Thus, the first trench 6e having a width of about 600 nm and a depth of, for example, about 40 nm is formed in the protective insulating film 6. The first trench 6e is formed at a formation scheduled site for a fine gate of a gate electrode to be formed at subsequent processes, side by side with the second trench 6b in the protective insulating film 6.

The resist mask 25 is removed by ashing using oxygen plasma or wet treatment using a chemical.

The case of forming the first trench 6e after forming the second trench 6b in the protective insulating film 6 is exemplified in FIG. 2B and FIG. 26B, but the order of processes may be inverted so that the second trench 6b may be formed after the first trench 6e is formed in the protective insulating film 6.

Subsequently, the processes in FIG. 3A to FIG. 3C of the first embodiment are performed. The state corresponding to FIG. 3C is illustrated in FIG. 26C.

A gate electrode 7 is in a so-called overhanging shape in which a fine gate 7A at a lower part fills the inside of the first trench 6e and an over gate 7B at an upper part is formed wider than the fine gate 7A. In the gate electrode 7, the fine gate 7A is located via a cap layer 2e and the protective insulating film 6 at the bottom of the first trench 6e, and one end (an electrode end on a drain electrode 5 side, defined as an OG end 7Ba) of the over gate 7B is located inside the second trench 6b. Specifically, the OG end 7Ba is formed at a site, inside the second trench 6b, away from an end portion on the gate electrode 7 side of the second trench 6b toward the drain electrode 5 by 0.2 μm or more, here about 0.2 μm.

Thereafter, through processes of electrical connection of a source electrode 4, the drain electrode 5, and the gate electrode 7 and so on, the MIS-type AlGaN/GaN HEMT is formed.

As described above, according to this embodiment, a highly reliable AlGaN/GaN HEMT is realized which relaxes the electric field concentration around the gate electrode 7 by a relatively simple structure to suppress deterioration or breakdown of the device characteristics so as to achieve high withstand voltage and high output power, as in the first embodiment. Further, since the part of the protective insulating film 6 also serves as the gate insulating film when forming the gate insulating film forming the MIS type, manufacturing processes are reduced.

MODIFICATION EXAMPLES

Hereinafter, modification examples of the MIS-type AlGaN/GaN HEMT according to the third embodiment will be described.

Modification Example 1

Modification Example 1 has a structure in which a part of the protective insulating film also serves as the gate insulating film in the AlGaN/GaN HEMT according to Modification Example 1 of the first embodiment. Note that the same constituent members and so on as those of the AlGaN/GaN HEMT according to the first embodiment or the like will be denoted by the same reference signs, and a detailed description thereof will be omitted.

Figure 27A:
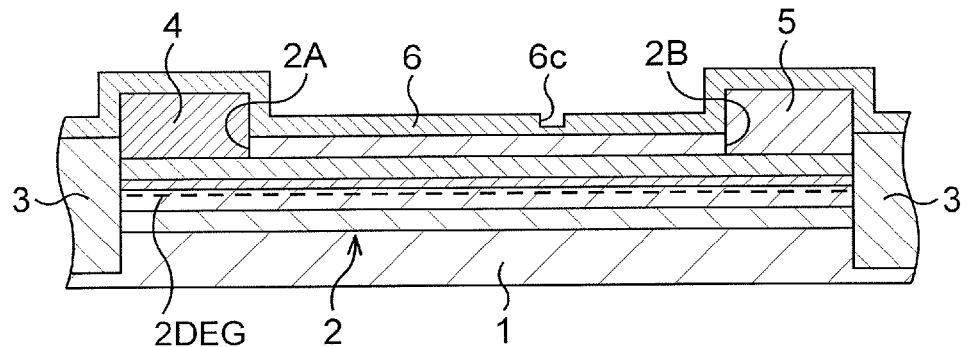
FIG. 27A to FIG. 27C are schematic cross-sectional views illustrating main processes in a method of manufacturing a MIS-type AlGaN/GaN HEMT according to Modification Example 1 of the third embodiment.
Figure 27B:
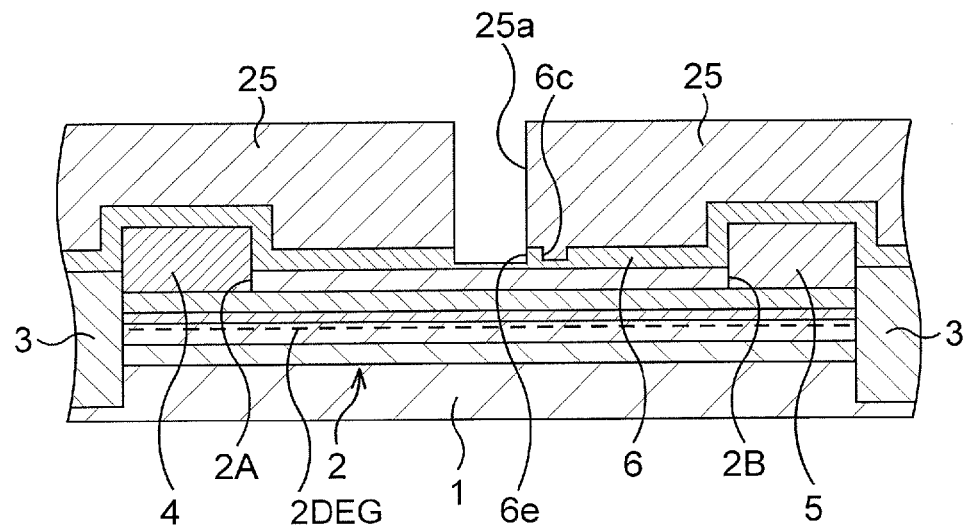
Figure 27C:
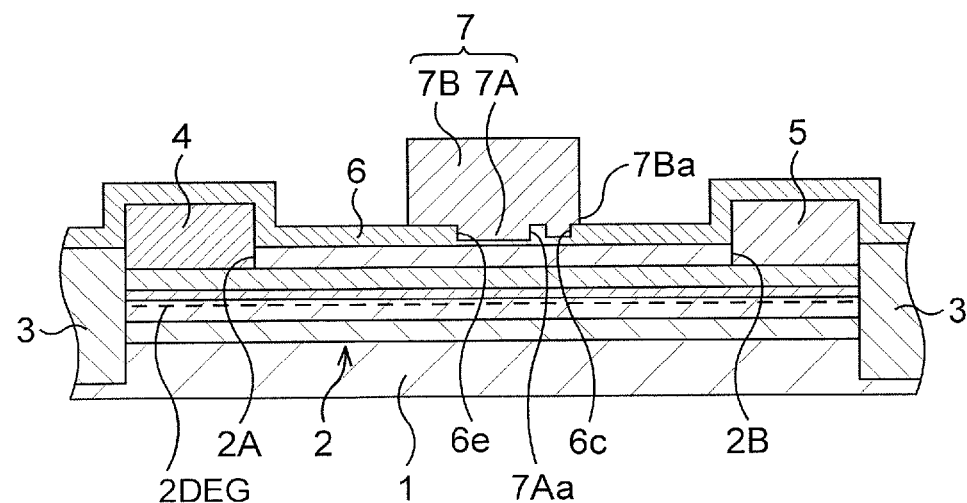

FIG. 27A to FIG. 27C are schematic cross-sectional views illustrating main processes in a method of manufacturing a MIS-type AlGaN/GaN HEMT according to Modification Example 1 of the third embodiment.

First, through the processes in FIG. 1A to FIG. 2A of the first embodiment and FIG. 8B in Modification Example 1 of the first embodiment, a second trench 6c is formed in a protective insulating film 6 that covers the whole surface of a compound semiconductor layer 2. The appearance in this event is illustrated in FIG. 27A.

Subsequently, as illustrated in FIG. 27B, a first trench 6e is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 25 having an opening 25a is formed.

Next, dry etching using the resist mask 25 is performed on the protective insulating film 6 so that the protective insulating film 6 remains with only a predetermined thickness in the opening 25a. The remaining portion of the protective insulating film 6 serves as a gate insulating film, and therefore the predetermined thickness is set to, for example, about 20 nm. For example, $SF_6$ is used as an etching gas. Thus, the first trench 6e having a width of about 600 nm and a depth of, for example, about 40 nm is formed in the protective insulating film 6. The first trench 6e is formed at a formation scheduled site for a fine gate of a gate electrode to be formed at subsequent processes, side by side with the second trench 6c in the protective insulating film 6.

The resist mask 25 is removed by ashing using oxygen plasma or wet treatment using a chemical.

The case of forming the first trench 6e after forming the second trench 6c in the protective insulating film 6 is exemplified in FIG. 8B and FIG. 27B, but the order of processes may be inverted so that the second trench 6c may be formed after the first trench 6e is formed in the protective insulating film 6.

Subsequently, the processes in FIG. 3A to FIG. 3C of the first embodiment are performed. The state corresponding to FIG. 3C is illustrated in FIG. 27C.

A gate electrode 7 is in an overhanging shape composed of a fine gate 7A at a lower part and an over gate 7B at an upper part wider than the fine gate 7A. The fine gate 7A fills the inside of the first trench 6e via a cap layer 2e and the protective insulating film 6 at the bottom of the first trench 6e. The over gate 7B fills the inside of the second trench 6c and has an OG end 7Ba located at a site away from an end portion on a drain electrode 5 side of the second trench 6c toward the drain electrode 5 by about 0.1 μm.

Thereafter, through processes of electrical connection of a source electrode 4, the drain electrode 5, and the gate electrode 7 and so on, the MIS-type AlGaN/GaN HEMT is formed.

As described above, according to Modification Example 1, the electric field concentration around the gate electrode 7 is relaxed by a relatively simple structure to suppress deterioration or breakdown of the device characteristics as in Modification Example 1 of the first embodiment. This realizes a highly reliable AlGaN/GaN HEMT which achieves high withstand voltage and high output power. Further, since the part of the protective insulating film 6 also serves as the gate insulating film when forming the gate insulating film forming the MIS type, manufacturing processes are reduced.

Modification Example 2

Modification Example 2 has a structure in which a part of the protective insulating film also serves as the gate insulating film in the AlGaN/GaN HEMT according to Modification Example 2 of the first embodiment. Note that the same constituent members and so on as those of the AlGaN/GaN HEMT according to the first embodiment or the like will be denoted by the same reference signs, and a detailed description thereof will be omitted.

Figure 28A:
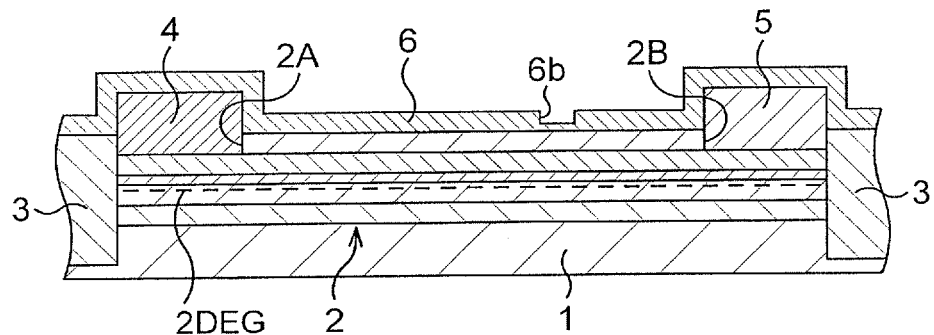
FIG. 28A to FIG. 28C are schematic cross-sectional views illustrating main processes in a method of manufacturing a MIS-type AlGaN/GaN HEMT according to Modification Example 2 of the third embodiment.
Figure 28B:
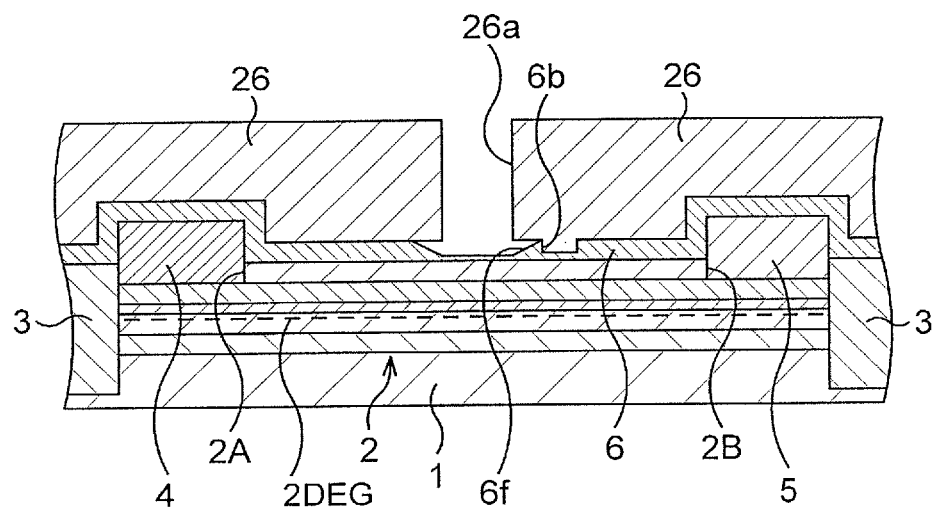
Figure 28C:
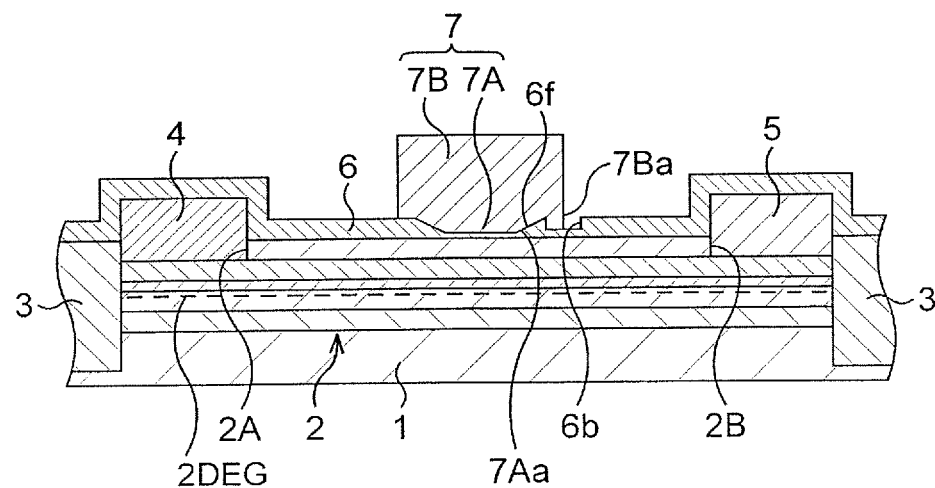

FIG. 28A to FIG. 28C are schematic cross-sectional views illustrating main processes in a method of manufacturing a MIS-type AlGaN/GaN HEMT according to Modification Example 2 of the third embodiment.

First, through the processes in FIG. 1A to FIG. 2B of the first embodiment, a second trench 6b is formed in a protective insulating film 6 that covers the whole surface of a compound semiconductor layer 2. The appearance in this event is illustrated in FIG. 28A.

Subsequently, as illustrated in FIG. 28B, a first trench 6f is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 26 having an opening 26a is formed.

Next, wet etching using the resist mask 26 is performed on the protective insulating film 6 so that the protective insulating film 6 remains with only a predetermined thickness at the bottom of the opening 26a. The remaining portion of the protective insulating film 6 serves as a gate insulating film, and therefore the predetermined thickness is set to, for example, about 20 nm. For example, buffered hydrofluoric acid is used as an etchant. Thus, the first trench 6f is formed in the protective insulating film 6. The first trench 6f is formed such that the depth is, for example, 40 nm, its side wall surface is formed into an inclined surface by the wet etching, the width of a bottom portion is about 600 nm, and an upper portion is wider than the bottom portion. With the first trench 6f, the protective insulating film 6 progressively decreases in thickness from the second trench 6b toward the first trench 6f at a site between the first trench 6f and the second trench 6b. The first trench 6f is formed at a formation scheduled site for a fine gate of a gate electrode to be formed at subsequent processes, side by side with the second trench 6b in the protective insulating film 6.

The resist mask 26 is removed by ashing using oxygen plasma or wet treatment using a chemical.

The case of forming the first trench 6f after forming the second trench 6b in the protective insulating film 6 is exemplified in FIG. 2B and FIG. 28B, but the order of processes may be inverted so that the second trench 6b may be formed after the first trench 6f is formed in the protective insulating film 6.

Subsequently, the processes in FIG. 3A to FIG. 3C of the first embodiment are performed. The state corresponding to FIG. 3C is illustrated in FIG. 28C.

A gate electrode 7 is in an overhanging shape composed of a fine gate 7A at a lower part and an over gate 7B at an upper part wider than the fine gate 7A. The fine gate 7A fills the inside of the first trench 6f via a cap layer 2e and the protective insulating film 6 at the bottom of the first trench 6f. The over gate 7B has one end (an electrode end on a drain electrode 5 side, defined as an OG end 7Ba) located inside the second trench 6b. Specifically, the OG end 7Ba is formed at a site, inside the second trench 6b, away from an end portion on the gate electrode 7 side of the second trench 6b toward the drain electrode 5 by 0.2 μm or more, here about 0.2 μm.

Thereafter, through processes of electrical connection of a source electrode 4, the drain electrode 5, and the gate electrode 7 and so on, the MIS-type AlGaN/GaN HEMT is formed.

As described above, according to Modification Example 2, the electric field concentration around the gate electrode 7 is relaxed by a relatively simple structure to suppress deterioration or breakdown of the device characteristics as in Modification Example 2 of the first embodiment. This realizes a highly reliable AlGaN/GaN HEMT which achieves high withstand voltage and high output power. Further, since the part of the protective insulating film 6 also serves as the gate insulating film when forming the gate insulating film forming the MIS type, manufacturing processes are reduced.

Modification Example 3

Modification Example 3 has a structure in which a part of the protective insulating film also serves as the gate insulating film in the AlGaN/GaN HEMT according to Modification Example 3 of the first embodiment. Note that the same constituent members and so on as those of the AlGaN/GaN HEMT according to the first embodiment or the like will be denoted by the same reference signs, and a detailed description thereof will be omitted.

Figure 29A:
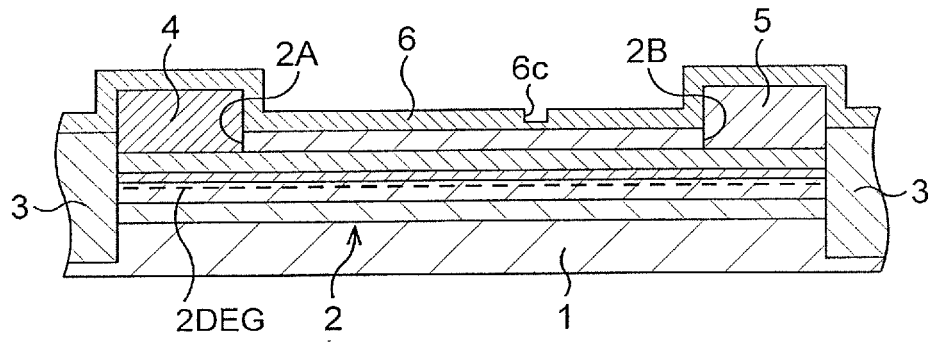
FIG. 29A to FIG. 29C are schematic cross-sectional views illustrating main processes in a method of manufacturing a MIS-type AlGaN/GaN HEMT according to Modification Example 3 of the second embodiment.
Figure 29B:
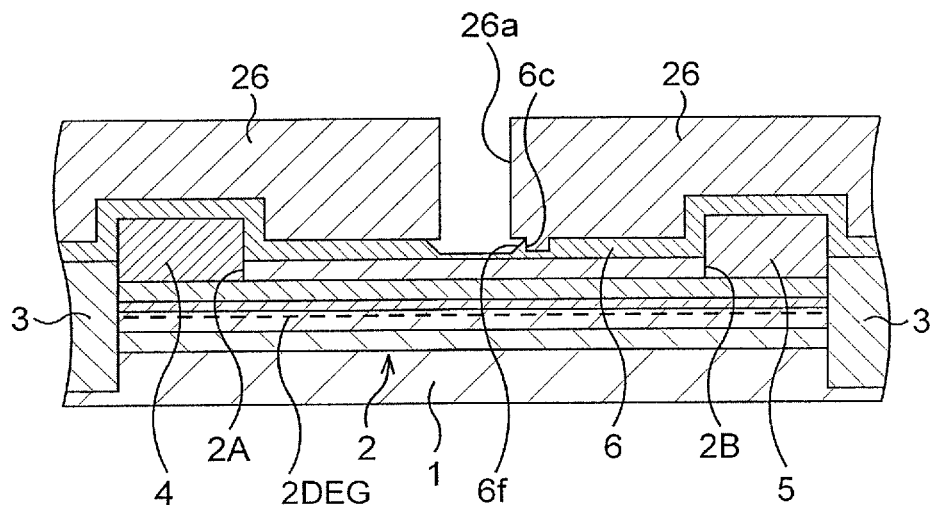
Figure 29C:
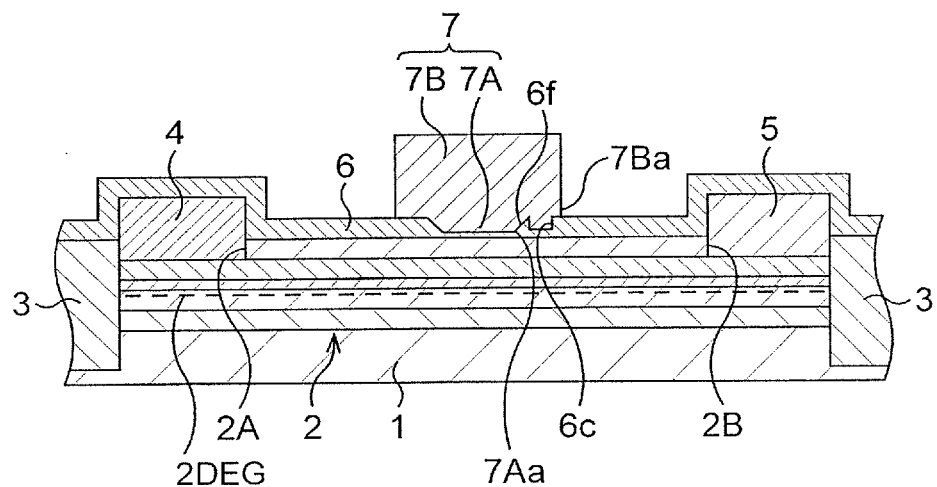

FIG. 29A to FIG. 29C are schematic cross-sectional views illustrating main processes in a method of manufacturing a MIS-type AlGaN/GaN HEMT according to Modification Example 3 of the third embodiment.

First, through the processes in FIG. 1A to FIG. 2A of the first embodiment and FIG. 17B in Modification Example 3 of the first embodiment, a second trench 6c is formed in a protective insulating film 6 that covers the whole surface of a compound semiconductor layer 2. The appearance in this event is illustrated in FIG. 29A.

Subsequently, as illustrated in FIG. 29B, a first trench 6f is formed in the protective insulating film 6.

More specifically, a resist is first applied on the whole surface of the protective insulating film 6. For example, PFI-32 (trade name) manufactured by Sumitomo Chemical Co., Ltd. is used as the resist. An ultraviolet method is used to perform, for example, exposure for an opening having a width of 600 nm on the applied resist, and the resist is developed. For example, NMD-W (trade name) manufactured by Tokyo Ohka Kogyo Co., Ltd. is used as a developing solution. Thus, a resist mask 26 having an opening 26a is formed.

Next, wet etching using the resist mask 26 is performed on the protective insulating film 6 so that the protective insulating film 6 remains with only a predetermined thickness at the bottom of the opening 26a. The remaining portion of the protective insulating film 6 serves as a gate insulating film, and therefore the predetermined thickness is set to, for example, about 20 nm. For example, buffered hydrofluoric acid is used as an etchant. Thus, the first trench 6f is formed in the protective insulating film 6. The first trench 6f is formed such that the depth is, for example, 40 nm, its side wall surface is formed into an inclined surface by the wet etching, the width of the bottom portion is about 600 nm, and an upper portion is wider than a bottom portion. With the first trench 6f, the protective insulating film 6 progressively decreases in thickness from the second trench 6c toward the first trench 6f at a site between the first trench 6f and the second trench 6c. The first trench 6f is formed at a formation scheduled site for a fine gate of a gate electrode to be formed at subsequent processes, side by side with the second trench 6c in the protective insulating film 6.

The resist mask 26 is removed by ashing using oxygen plasma or wet treatment using a chemical.

The case of forming the first trench 6f after forming the second trench 6c in the protective insulating film 6 is exemplified in FIG. 17B and FIG. 29B, but the order of processes may be inverted so that the second trench 6c may be formed after the first trench 6f is formed in the protective insulating film 6.

Subsequently, the processes in FIG. 3A to FIG. 3C of the first embodiment are performed. The state corresponding to FIG. 3C is illustrated in FIG. 29C.

A gate electrode 7 is in an overhanging shape composed of a fine gate 7A at a lower part and an over gate 7B at an upper part wider than the fine gate 7A. The fine gate 7A fills the inside of the first trench 6f via a cap layer 2e and the protective insulating film 6 at the bottom of the first trench 6f. The over gate 7B fills the inside of the second trench 6c and has an OG end 7Ba located at a site away from an end portion on a drain electrode 5 side of the second trench 6c toward the drain electrode 5 by about 0.1 μm.

Thereafter, through processes of electrical connection of a source electrode 4, the drain electrode 5, and the gate electrode 7 and so on, the MIS-type AlGaN/GaN HEMT is formed.

As described above, according to Modification Example 3, the electric field concentration around the gate electrode 7 is relaxed by a relatively simple structure to suppress deterioration or breakdown of the device characteristics as in Modification Example 3 of the first embodiment. This realizes a highly reliable AlGaN/GaN HEMT which achieves high withstand voltage and high output power. Further, since the part of the protective insulating film 6 also serves as the gate insulating film when forming the gate insulating film forming the MIS type, manufacturing processes are reduced.

Fourth Embodiment

This embodiment discloses a power supply device including one kind selected from among the AlGaN/GaN HEMTs according to the first to third embodiments and their modification examples.

Figure 30:
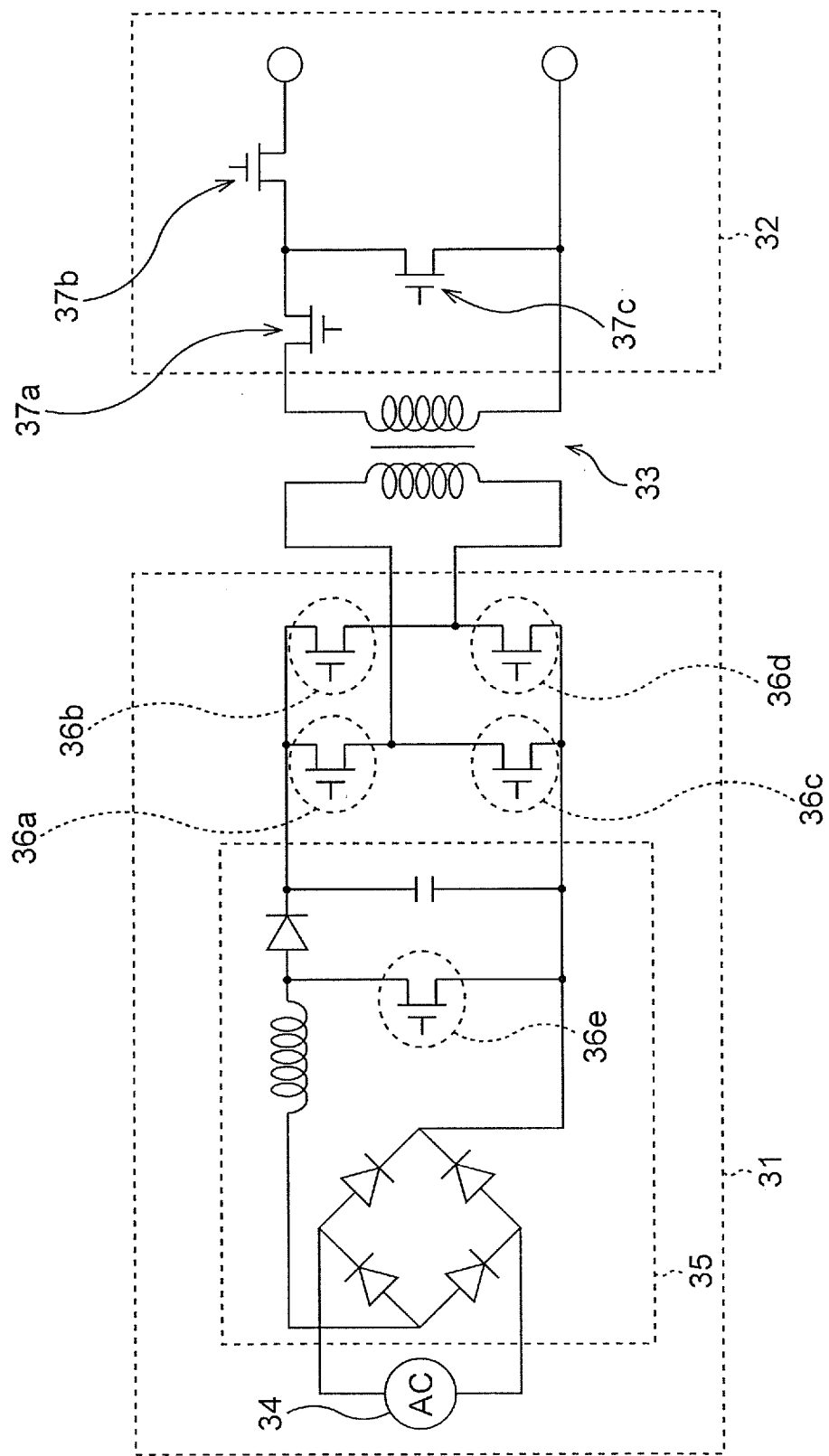
FIG. 30 is a connection diagram illustrating a schematic configuration of a power supply device according to a fourth embodiment.

FIG. 30 is a connection diagram illustrating a schematic configuration of a power supply device according to a fourth embodiment.

The power supply device according to this embodiment includes a high-voltage primary-side circuit 31, a low-voltage secondary-side circuit 32, and a transformer 33 disposed between the primary-side circuit 31 and the secondary-side circuit 32.

The primary-side circuit 31 includes an AC power supply 34, a so-called bridge rectifying circuit 35, and a plurality of (four here) switching elements 36a, 36b, 36c, 36d. Further, the bridge rectifying circuit 35 has a switching element 36e.

The secondary-side circuit 32 includes a plurality of (three here) switching elements 37a, 37b, 37c.

In this embodiment, the switching elements 36a, 36b, 36c, 36d, 36e of the primary-side circuit 31 are each one kind selected from among the AlGaN/GaN HEMTs according to the first to third embodiments and their modification examples. On the other hand, the switching elements 37a, 37b, 37c of the secondary-side circuit 32 are each an ordinary MIS•FET using silicon.

In this embodiment, the AlGaN/GaN HEMT that relaxes the electric field concentration around a gate electrode 7 by a relatively simple structure to suppress deterioration or breakdown of the device characteristics is applied to the high-voltage circuit. This realizes a highly reliable large-power power supply circuit.

Fifth Embodiment

This embodiment discloses a high-frequency amplifier including one kind selected from among the AlGaN/GaN HEMTs according to the first to third embodiments and their modification examples.

Figure 31:
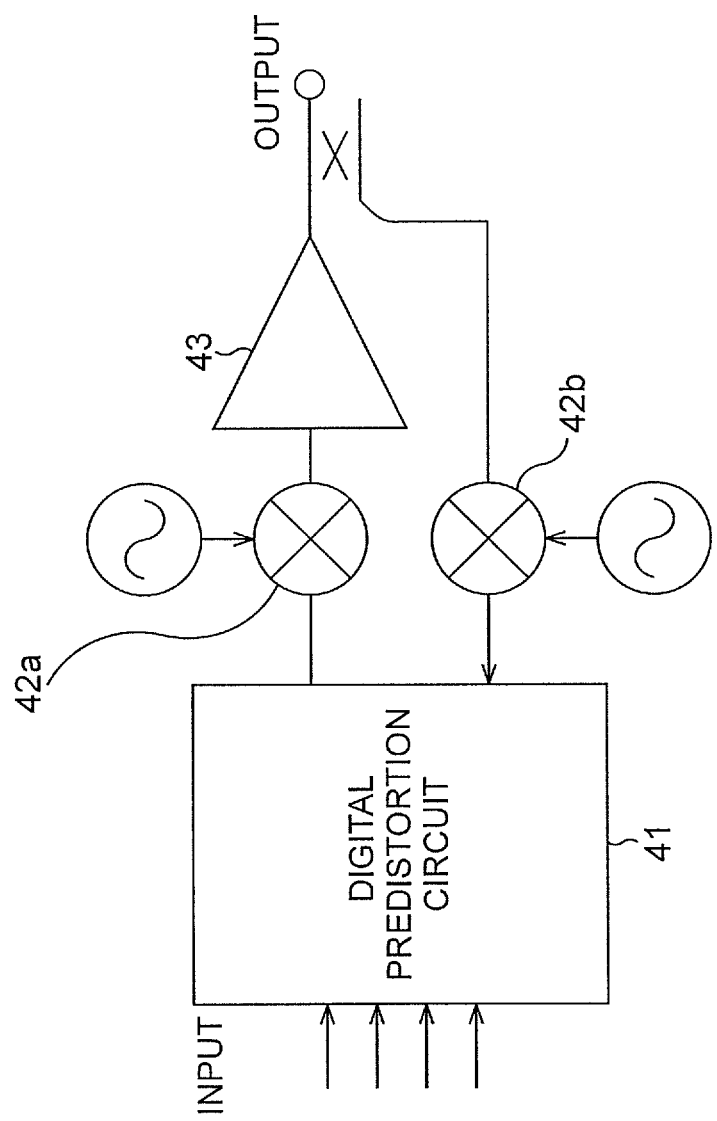
FIG. 31 is a connection diagram illustrating a schematic configuration of a high-frequency amplifier according to a fifth embodiment.

FIG. 31 is a connection diagram illustrating a schematic configuration of a high-frequency amplifier according to a fifth embodiment.

The high-frequency amplifier according to this embodiment includes a digital pre-distortion circuit 41, mixers 42a, 42b, and a power amplifier 43.

The digital pre-distortion circuit 41 compensates nonlinear distortion of an input signal. The mixer 42a mixes the input signal whose nonlinear distortion is compensated and an AC signal. The power amplifier 43 amplifies the input signal mixed with the AC signal, and has one kind selected from among the AlGaN/GaN HEMTs according to the first to third embodiments and their modification examples. In FIG. 31, by, for example, changing the switches, an output-side signal can be mixed with the AC signal by the mixer 42b, and the resultant can be sent out to the digital pre-distortion circuit 41.

In this embodiment, the AlGaN/GaN HEMT that relaxes the electric field concentration around a gate electrode 7 by a relatively simple structure to suppress deterioration or breakdown of the device characteristics is applied to the high-frequency amplifier. This realizes a highly reliable high-withstand-voltage high-frequency amplifier.

Other Embodiments

In the first to third embodiments and their modification examples, and the fourth and fifth embodiments, the AlGaN/

GaN HEMTs are exemplified as the compound semiconductor devices. Other than the AlGaN/GaN HEMTs, the following HEMTs are applicable as the compound semiconductor devices.

Other HEMT Example 1

This example discloses an InAlN/GaN HEMT as a compound semiconductor device.

InAlN and GaN are compound semiconductors whose lattice constants can be made close to each other by their compositions. In this case, in the above-described first to third embodiments and their modification examples and the fourth to fifth embodiments, the electron transit layer is formed of i-GaN, the intermediate layer is formed of AlN, the electron supply layer is formed of n-InAlN, and the cap layer is formed of n-GaN. The n-GaN of the cap layer can be omitted as necessary. Further, since almost no piezoelectric polarization occurs in this case, two-dimensional electron gas is mainly generated by spontaneous polarization of InAlN.

According to this example, the electric field concentration around the gate electrode is relaxed by a relatively simple structure to suppress deterioration or breakdown of the device characteristics as in the above-described AlGaN/GaN HEMTs. This realizes a highly reliable InAlN/GaN HEMT which achieves high withstand voltage and high output power.

Other HEMT Example 2

This example discloses an InAlGaN/GaN HEMT as a compound semiconductor device.

GaN and InAlGaN are compound semiconductors that the lattice constant of the latter is smaller than the lattice constant of the former. In this case, in the above-described first to third embodiments and their modification examples and the fourth to fifth embodiments, the electron transit layer is formed of i-GaN, the intermediate layer is formed of i-InAlGaN, the electron supply layer is formed of n-InAlGaN, and the cap layer is formed of $n^+$-GaN. The $n^+$-GaN of the cap layer can be omitted as necessary.

According to this example, the electric field concentration around the gate electrode is relaxed by a relatively simple structure to suppress deterioration or breakdown of the device characteristics as in the above-described AlGaN/GaN HEMTs. This realizes a highly reliable InAlGaN/GaN HEMT which achieves high withstand voltage and high output power.

According to the above-described aspects, a highly reliable compound semiconductor device can be realized which relaxes the electric field concentration around an electrode by a relatively simple structure to suppress deterioration or breakdown of device characteristics so as to achieve high withstand voltage and high output power.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a compound semiconductor layer;
   a protective insulating film that covers a top of the compound semiconductor layer; and
   a gate electrode in which a first portion at a lower part and a second portion being wider than the first portion at an upper part are integrally formed, and a lower surface of the first portion is formed on the protective insulating film or on the compound semiconductor layer,
   wherein the protective insulating film has a first trench and a non-through second trench which is formed side by side with the first trench, and
   wherein the first portion of the gate electrode fills the first trench, the second portion covers a part of an upper surface of the protective insulating film, and one end of the second portion is away from the first trench and located at least in the second trench.

2. The compound semiconductor device according to claim 1,
   wherein the protective insulating film decreases in thickness at a site between the first trench and the second trench progressively from the second trench toward the first trench.

3. The compound semiconductor device according to claim 1,
   wherein the electrode fills the second trench, and the one end is located beyond the second trench in a direction away from the first trench.

4. The compound semiconductor device according to claim 1,
   wherein the gate electrode fills the first trench formed as a through trench and is in contact with the compound semiconductor layer.

5. The compound semiconductor device according to claim 1,
   wherein the first trench is formed such that the protective insulating film remains with only a predetermined thickness on a bottom thereof, and
   wherein the electrode is formed on the compound semiconductor layer via a bottom portion of the protective insulating film.

6. The compound semiconductor device according to claim 1,
   wherein the first trench is formed as a through trench,
   wherein the compound semiconductor device further comprises a gate insulating film formed on the protective insulating film in a manner to cover an inner wall surface of the first trench, and
   wherein the electrode is formed on the compound semiconductor layer via the gate insulating film.

7. A power supply circuit comprising a transformer, and a high-voltage circuit and a low-voltage circuit across the transformer,
   the high-voltage circuit comprising a transistor,
   the transistor comprising:
      a compound semiconductor layer;
      a protective insulating film that covers a top of the compound semiconductor layer; and
      a gate electrode in which a first portion at a lower part and a second portion being wider than the first portion at an upper part are integrally formed, and a lower surface of the first portion is formed on the protective insulating film or on the compound semiconductor layer, wherein the protective insulating film has a first trench and a non-through second trench which is formed side by side with the first trench, wherein the first portion of the gate electrode fills the first trench, the second portion covers a part of an upper surface of the protective insulating film, and one end of the electrode second portion is away from the first trench and located at least in the second trench.

\* \* \* \* \*